(12) United States Patent
Chowdhury et al.

(10) Patent No.: US 10,748,894 B2
(45) Date of Patent: *Aug. 18, 2020

(54) THREE-DIMENSIONAL MEMORY DEVICE CONTAINING BOND PAD-BASED POWER SUPPLY NETWORK FOR A SOURCE LINE AND METHODS OF MAKING THE SAME

(71) Applicant: SANDISK TECHNOLOGIES LLC, Addison, TX (US)

(72) Inventors: Murshed Chowdhury, Fremont, CA (US); Kwang-Ho Kim, Pleasanton, CA (US); James Kai, Santa Clara, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/251,954

(22) Filed: Jan. 18, 2019

(65) Prior Publication Data

US 2020/0235090 A1 Jul. 23, 2020

(51) Int. Cl.
*G11C 15/00* (2006.01)
*H01L 27/06* (2006.01)
(Continued)

(52) U.S. Cl.
CPC .......... *H01L 27/0688* (2013.01); *G11C 5/02* (2013.01); *H01L 23/481* (2013.01); *H01L 24/73* (2013.01);
(Continued)

(58) Field of Classification Search
CPC ....................................................... G11C 5/02
(Continued)

(56) References Cited

U.S. PATENT DOCUMENTS 5,915,167 A 6/1999 Leedy
10,510,738 B2 * 12/2019 Kim et al. ............. H01L 25/18
257/314
(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — Hoai V Ho
(74) *Attorney, Agent, or Firm* — The Marbury Law Group PLLC

(57) ABSTRACT

A memory die includes an alternating stack of insulating layers and electrically conductive layers located over a substrate, memory stack structures extending through the alternating stack, source regions located on, or in, the substrate, and at least one memory-side bonding pad electrically connected to the source regions. A logic die includes a power supply circuit configured to generate a supply voltage for the source regions, and at least one logic-side bonding pad electrically connected to the power supply circuit through a network of logic-side metal interconnect structures. The memory die is bonded to the logic die. The network of logic-side metal interconnect structures distributes source power from the power supply circuit over an entire area of the memory stack structures and transmits the source power to the memory die through bonded pairs of memory-side bonding pads and logic-side bonding pads.

20 Claims, 33 Drawing Sheets

(51) Int. Cl.
  *H01L 27/108* (2006.01)
  *H01L 27/11529* (2017.01)
  *G11C 5/02* (2006.01)
  *H01L 23/48* (2006.01)
  *H01L 23/00* (2006.01)
  *H01L 27/1157* (2017.01)

(52) U.S. Cl.
  CPC .... *H01L 27/10897* (2013.01); *H01L 27/1157* (2013.01); *H01L 27/11529* (2013.01)

(58) Field of Classification Search
  USPC .......................................................... 365/51
  See application file for complete search history.

(56) References Cited

U.S. PATENT DOCUMENTS

| | | |
|---|---|---|
| 2014/0061750 A1 | 3/2014 | Kwon et al. |
| 2016/0079164 A1 | 3/2016 | Fukuzumi et al. |
| 2017/0040338 A1 | 2/2017 | Lee et al. |
| 2017/0352678 A1* | 12/2017 | Lu .................. H01L 21/4846 |
| 2017/0373084 A1 | 12/2017 | Shim et al. |
| 2018/0358374 A1 | 12/2018 | Kim et al. |

OTHER PUBLICATIONS

U.S. Appl. No. 15/873,101, filed Jan. 17, 2018, SanDisk Technologies LLC.
U.S. Appl. No. 15/892,648, filed Feb. 9, 2018, SanDisk Technologies LLC.
U.S. Appl. No. 15/928,407, filed Mar. 22, 2018, SanDisk Technologies LLC.
U.S. Appl. No. 15/960,267, filed Apr. 23, 2018, SanDisk Technologies LLC.
U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/248,923, filed Jan. 16, 2019, SanDisk Technologies LLC.
Notification of Transmittal of the International Search Report and Written Opinion of the International Search Authority or International Patent Application No. PCT/US2019/062742, dated Apr. 8, 2020, 9 pages.

\* cited by examiner

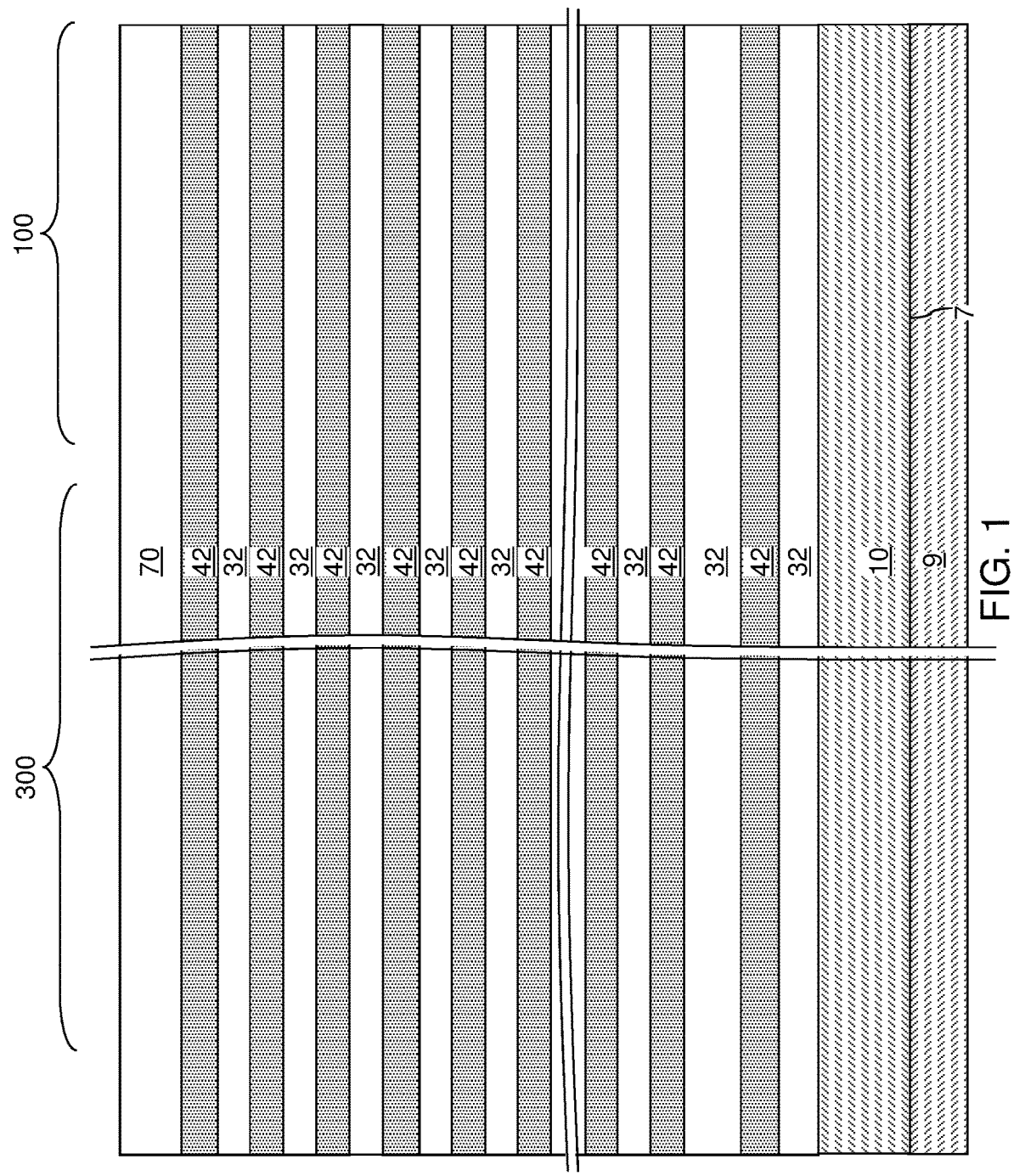

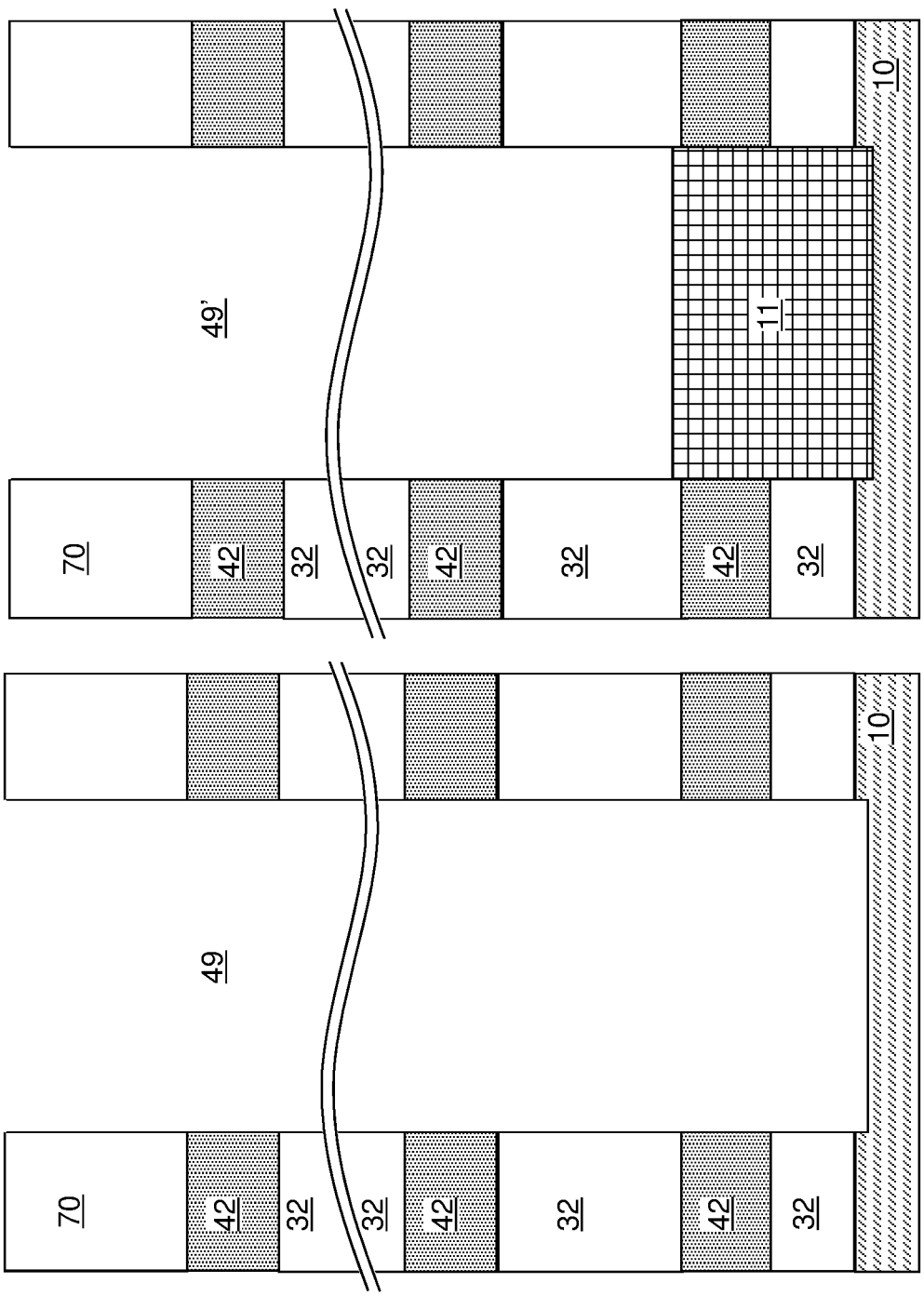

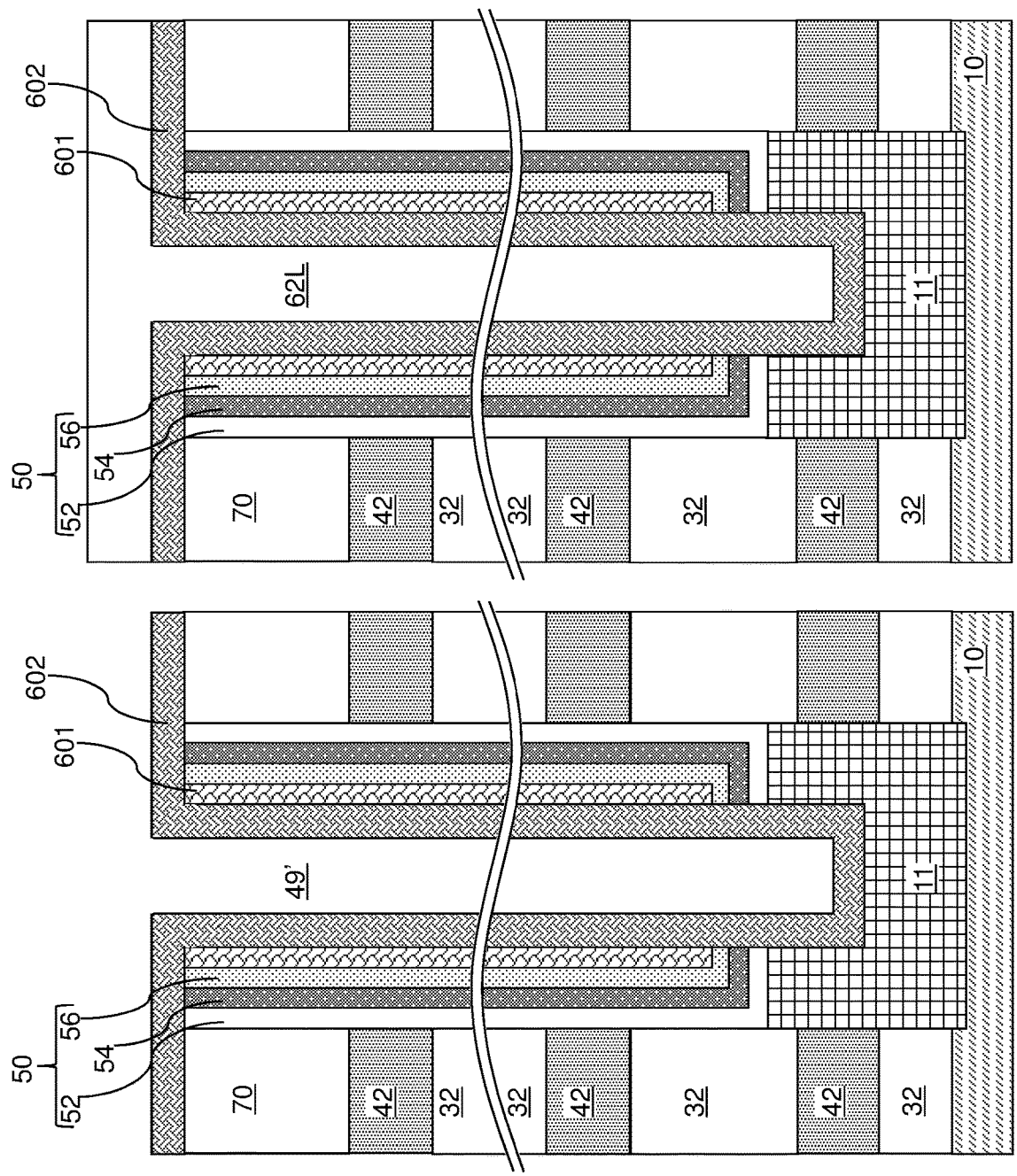

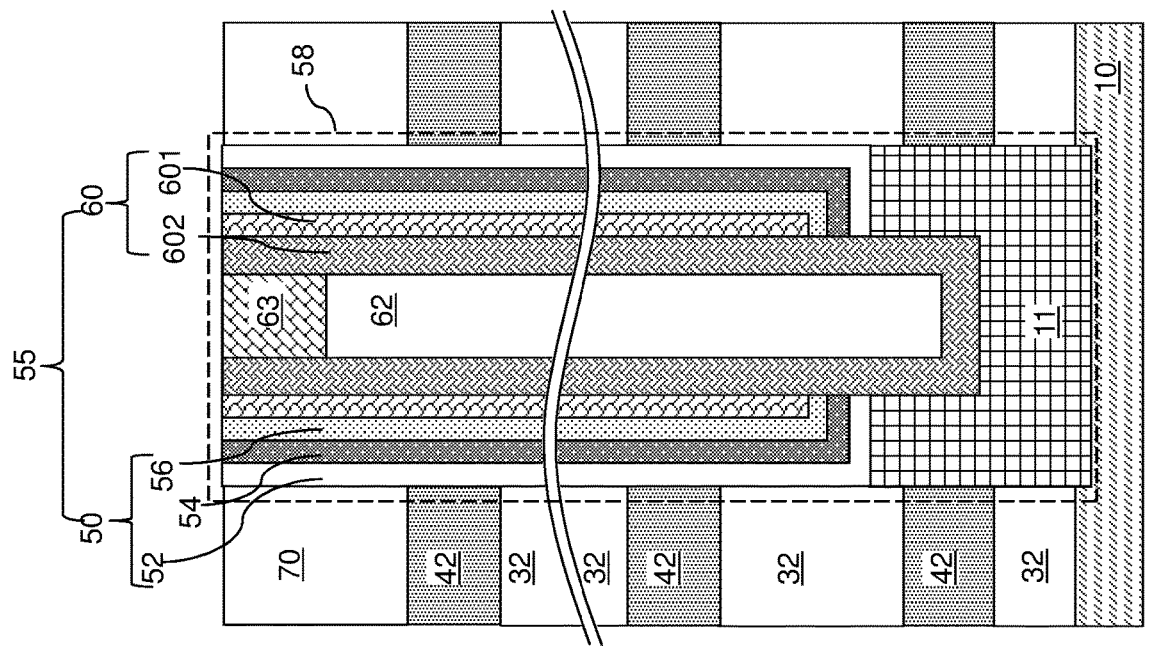
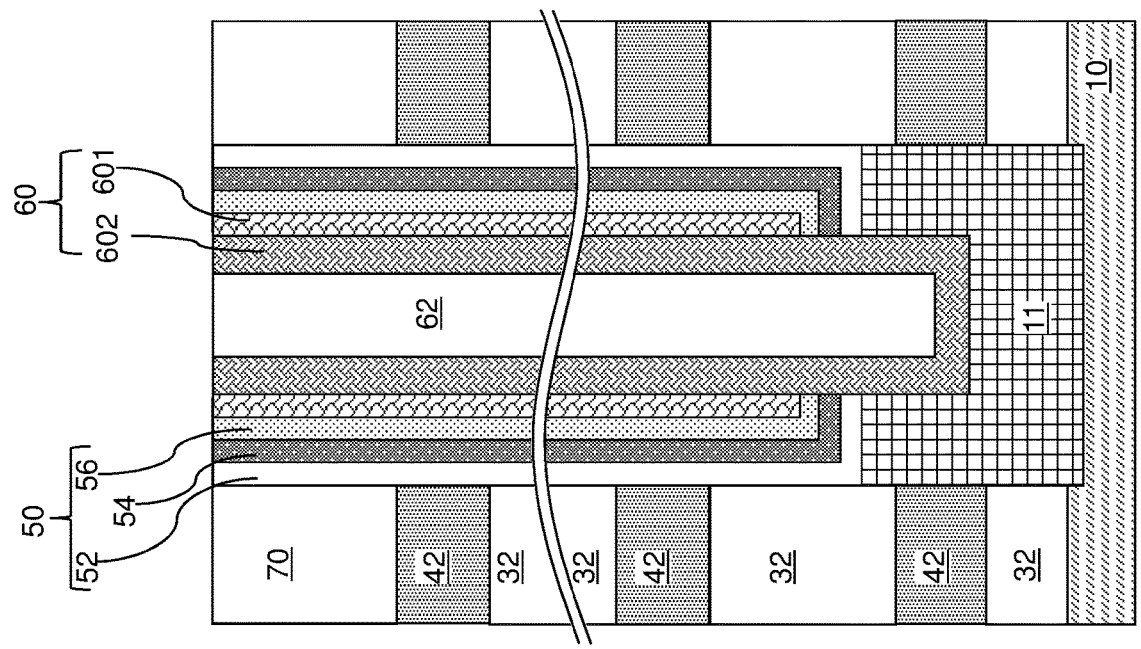

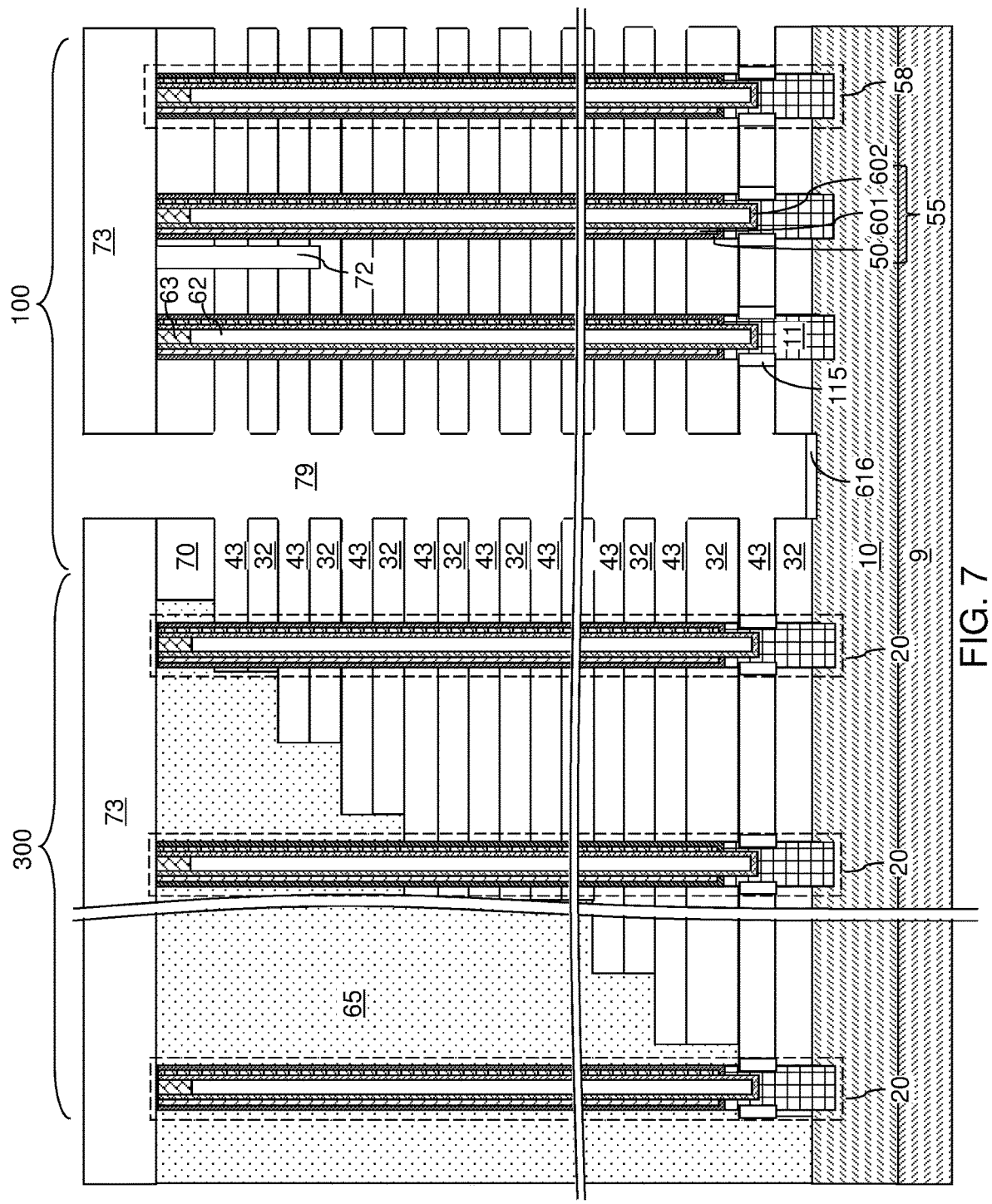

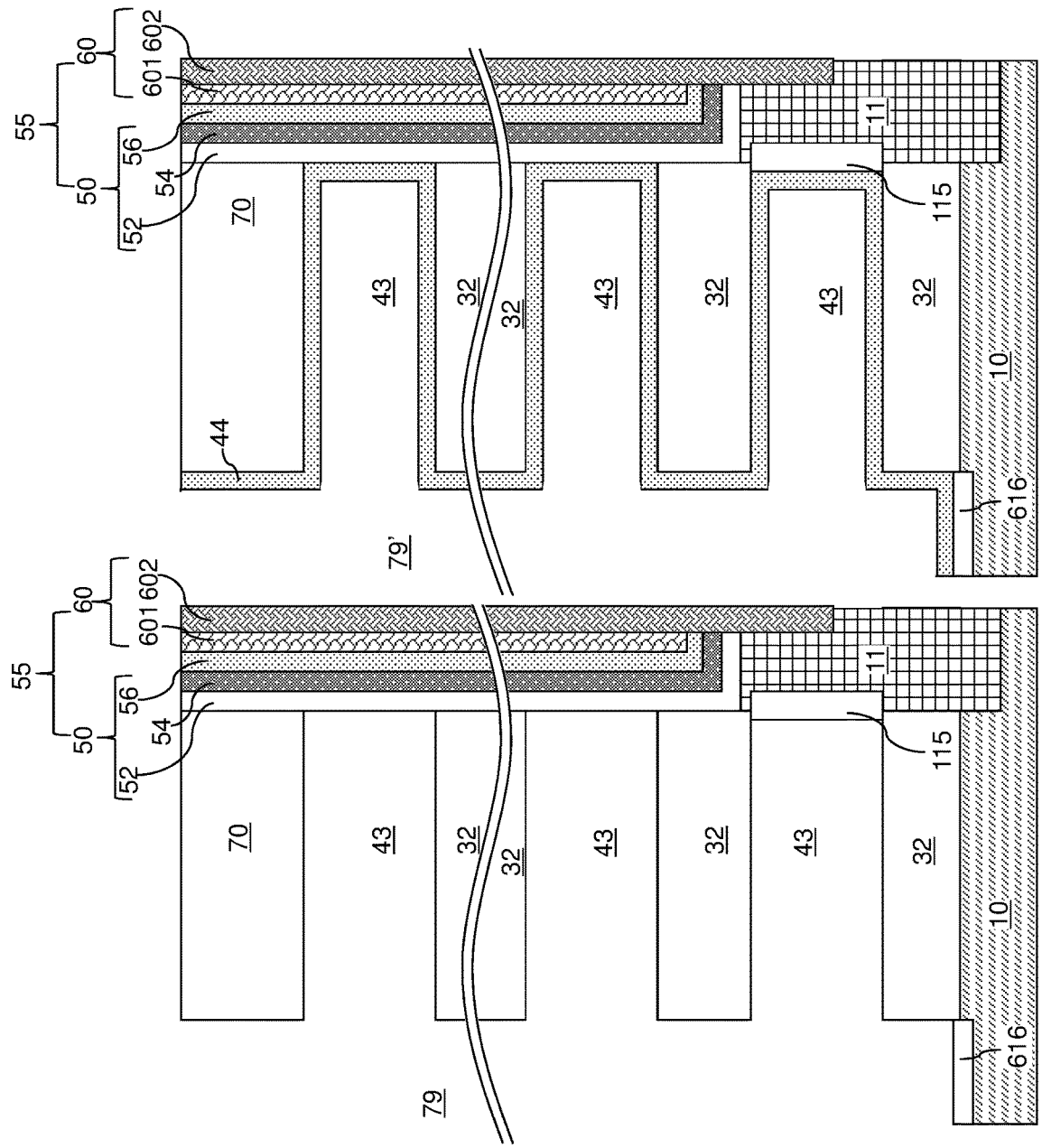

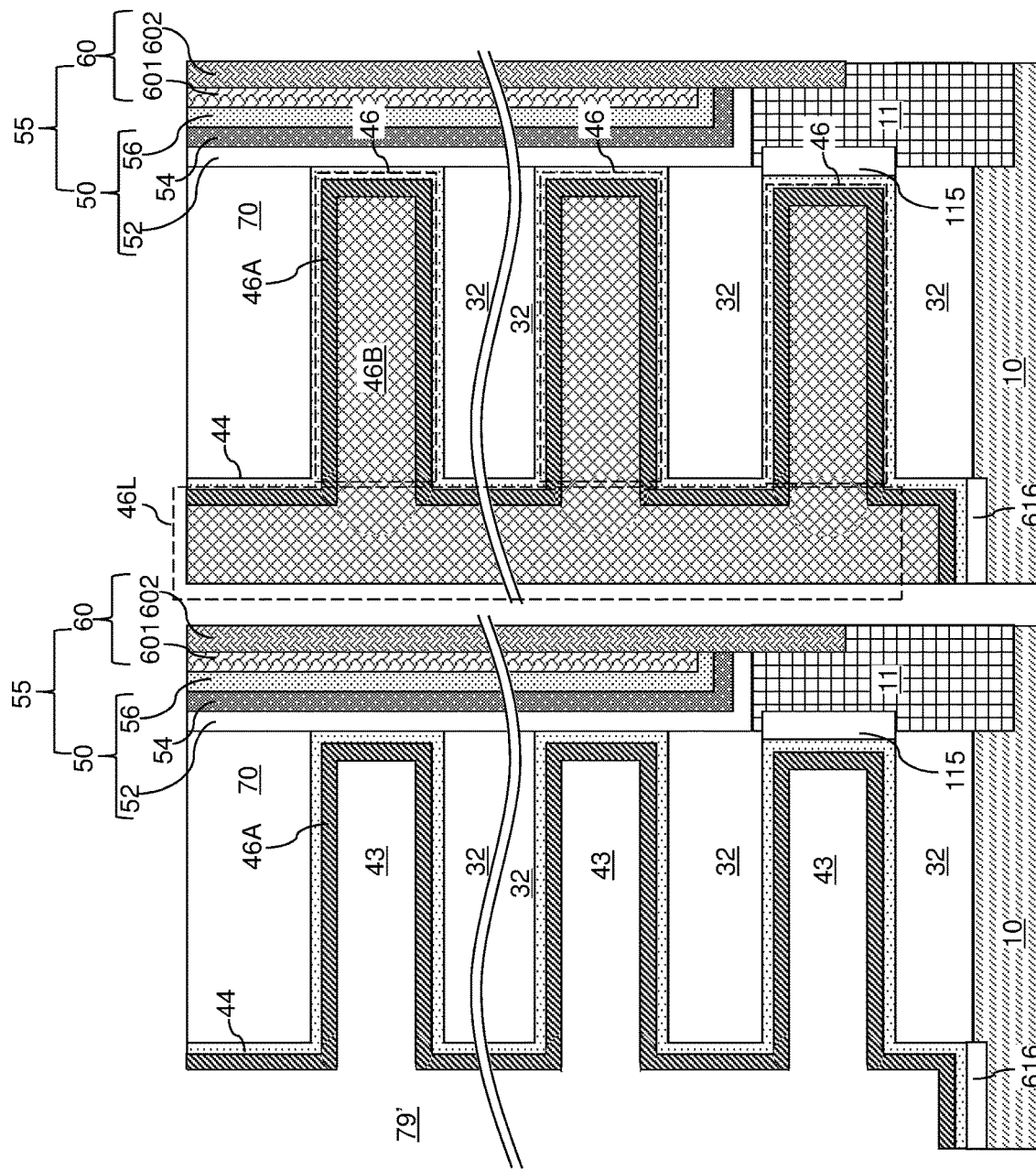

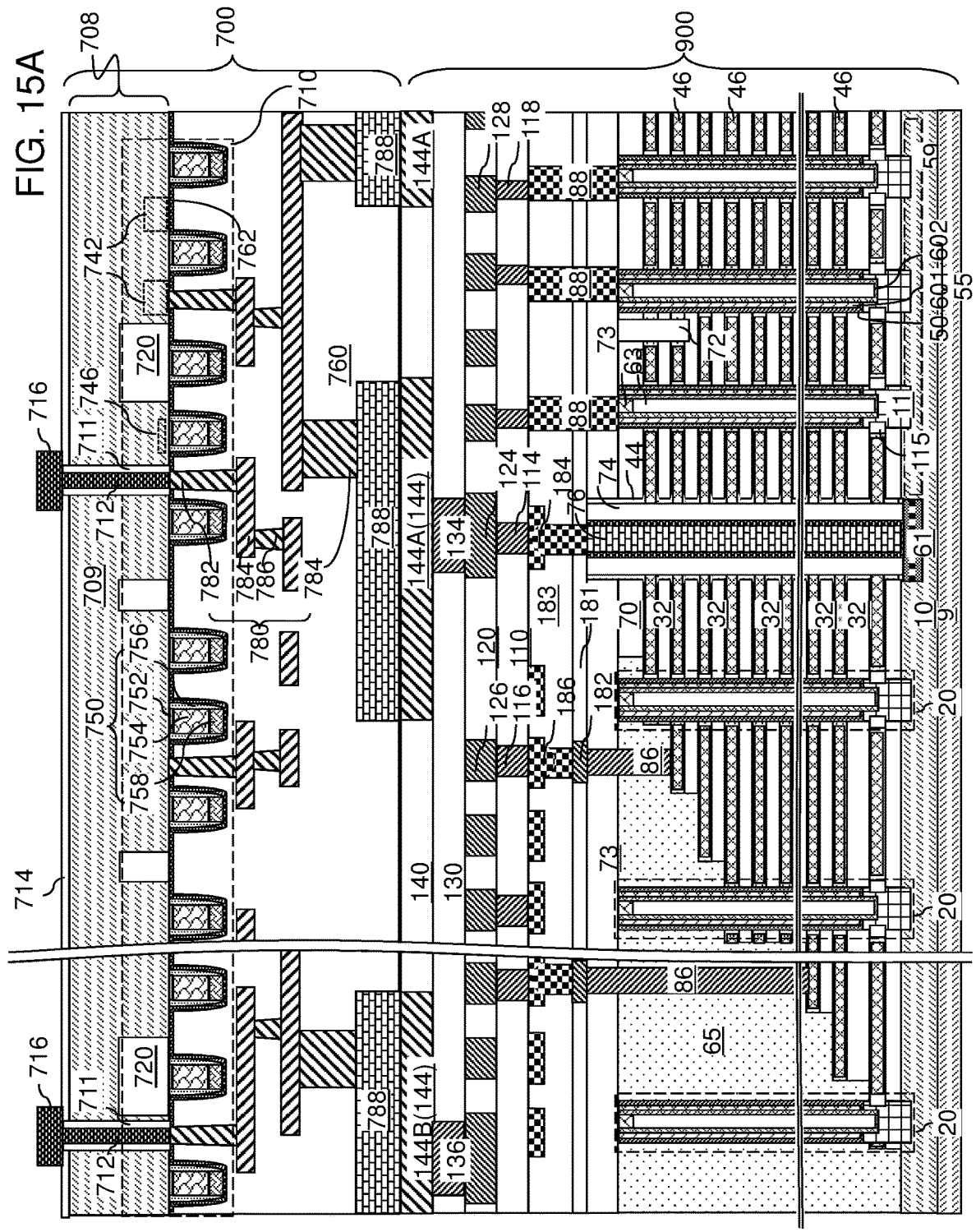

THREE-DIMENSIONAL MEMORY DEVICE CONTAINING BOND PAD-BASED POWER SUPPLY NETWORK FOR A SOURCE LINE AND METHODS OF MAKING THE SAME

FIELD

The present disclosure relates generally to the field of semiconductor devices, and particular to a three-dimensional memory device employing a bond pad-based power supply network for a source line and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a bonded assembly comprising a memory die and a logic die is provided. The memory die comprises: an alternating stack of insulating layers and electrically conductive layers located over a substrate; memory stack structures extending through the alternating stack, wherein each of the memory stack structures comprises a memory film and a vertical semiconductor channel; source regions located on or in the substrate; source contact structures vertically extending through the alternating stack and contacting the source regions; and at least one memory-side bonding pad electrically connected to the source contact structures through a subset of memory-side metal interconnect structures. The logic die comprises: a power supply circuit configured to generate a supply voltage for the source regions; and at least one logic-side bonding pad electrically connected to the power supply circuit through a network of logic-side metal interconnect structures and bonded to the at least one memory-side bonding pad.

According to another aspect of the present disclosure, a method of forming a bonded assembly is provided, which comprises: providing a memory die that comprises: an alternating stack of insulating layers and electrically conductive layers located over a substrate, memory stack structures extending through the alternating stack, wherein each of the memory stack structures comprises a memory film and a vertical semiconductor channel, source regions located on, or in, the substrate, source contact structures vertically extending through the alternating stack and contacting the source regions, and at least one memory-side bonding pad electrically connected to the source contact structures through a subset of memory-side metal interconnect structures; providing a logic die that comprises: a power supply circuit configured to generate a supply voltage for the source regions, and at least one logic-side bonding pad electrically connected to the power supply circuit through a network of logic-side metal interconnect structures; and bonding the at least one logic-side bonding pad to the at least one memory-side bonding pad.

BRIEF DESCRIPTION OF THE DRAWINGS

FIG. 1 is a schematic vertical cross-sectional view of an exemplary structure after formation of an alternating stack of insulating layers and sacrificial material layers according to an embodiment of the present disclosure.

FIGS. 4A-4H are sequential schematic vertical cross-sectional views of a memory opening within the exemplary structure during formation of a memory stack structure, an optional dielectric core, and a drain region therein according to an embodiment of the present disclosure.

FIG. 7 is a schematic vertical cross-sectional view of the exemplary structure after formation of backside recesses according to an embodiment of the present disclosure.

FIGS. 8A-8D are sequential vertical cross-sectional views of a region of the exemplary structure during formation of electrically conductive layers according to an embodiment of the present disclosure.

FIG. 15A is a vertical cross-sectional view of a first configuration of a bonded assembly of a memory die and a logic die according to an embodiment of the present disclosure.

DETAILED DESCRIPTION

Figure 2A:
FIG. 2A is a schematic vertical cross-sectional view of the exemplary structure after formation of stepped terraces and a retro-stepped dielectric material portion according to an embodiment of the present disclosure.

As discussed above, the embodiments of the present disclosure are directed to a three-dimensional memory device employing a bond pad-based power supply network for a source line in a three-dimensional memory device and methods of manufacturing the same, the various aspects of which are described below. This source-side power supply provides low resistance conductive paths to each vertical NAND string in the three-dimensional memory device to provide a low voltage drop on the source side, such that the vertical NAND strings operate with little or no current loss. The embodiments of the disclosure can be used to form various structures including a multilevel memory structure, non-limiting examples of which include semiconductor devices such as three-dimensional monolithic memory array devices comprising a plurality of NAND memory strings. The embodiments of the disclosure can be used to form a bonded assembly of a memory die and a semiconductor die, which may be a logic die or an additional memory die.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "proto-type" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices of various embodiments of the present disclosure include monolithic three-dimensional NAND string memory devices, and can be fabricated using the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. When a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, an exemplary structure according to an embodiment of the present disclosure is illustrated, which can be used, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the descriptions of the present disclosure use an embodiment in which the spacer material layers are sacrificial material layers 42 that are subsequently replaced with electrically conductive layers, in other embodiments the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2B:
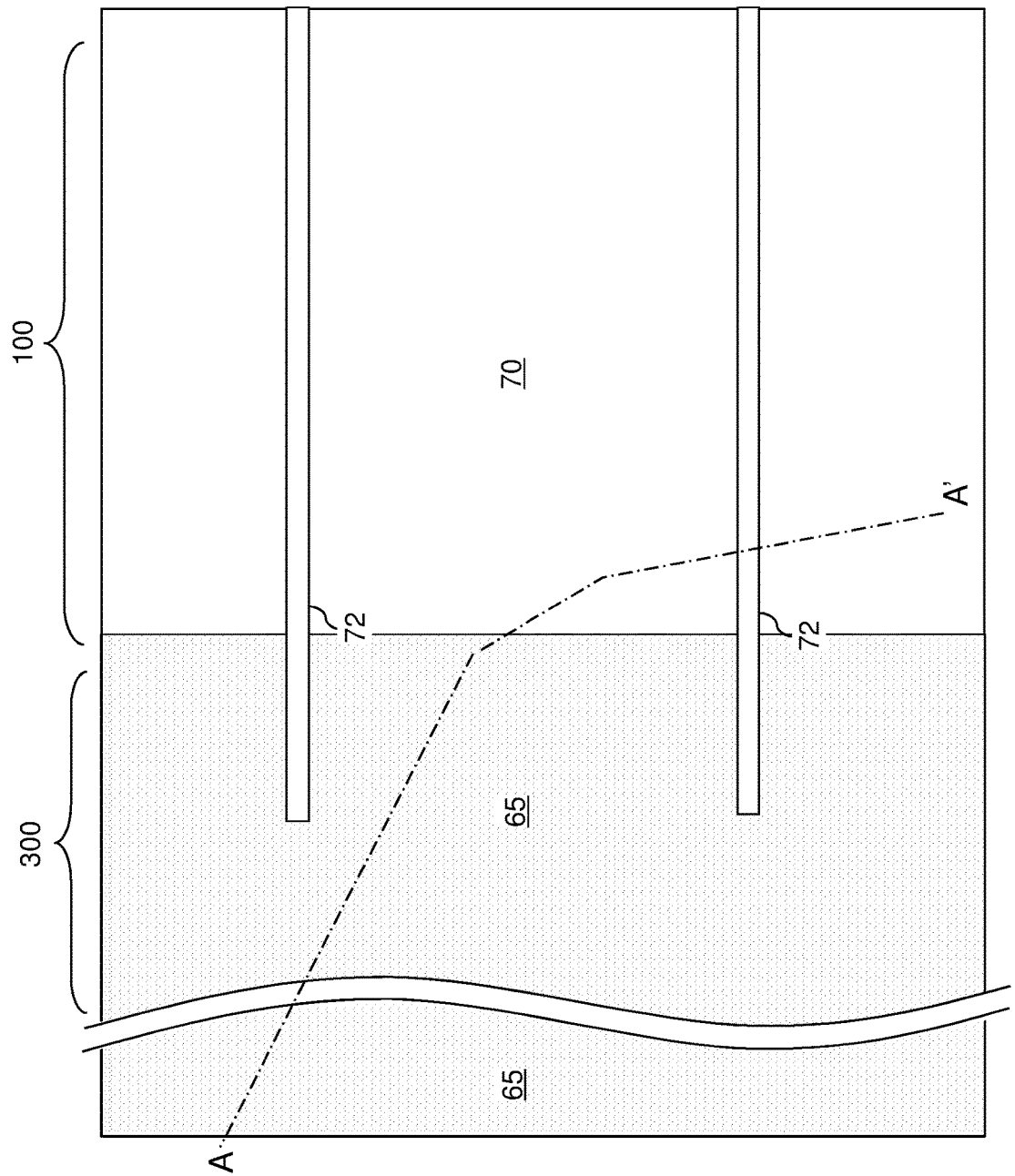
FIG. 2B is a top-down view of the exemplary structure of FIG. 2A. The vertical plane A-A' is the plane of the cross-section for FIG. 2A.

Referring to FIGS. 2A and 2B, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located adjacent to the memory array region 100. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset one from another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 3A:
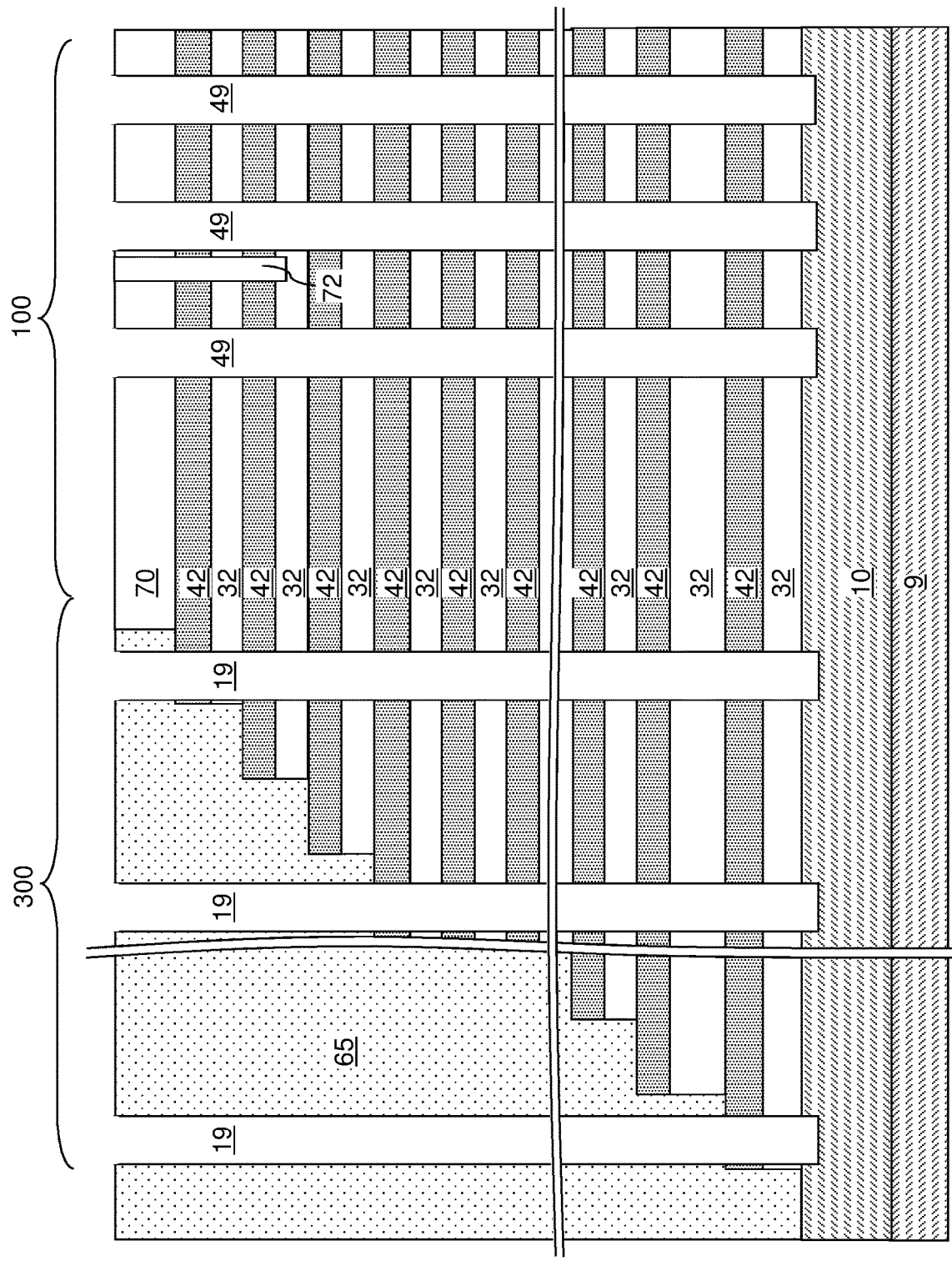
FIG. 3A is a schematic vertical cross-sectional view of the exemplary structure after formation of memory openings and support openings according to an embodiment of the present disclosure.
Figure 3B:
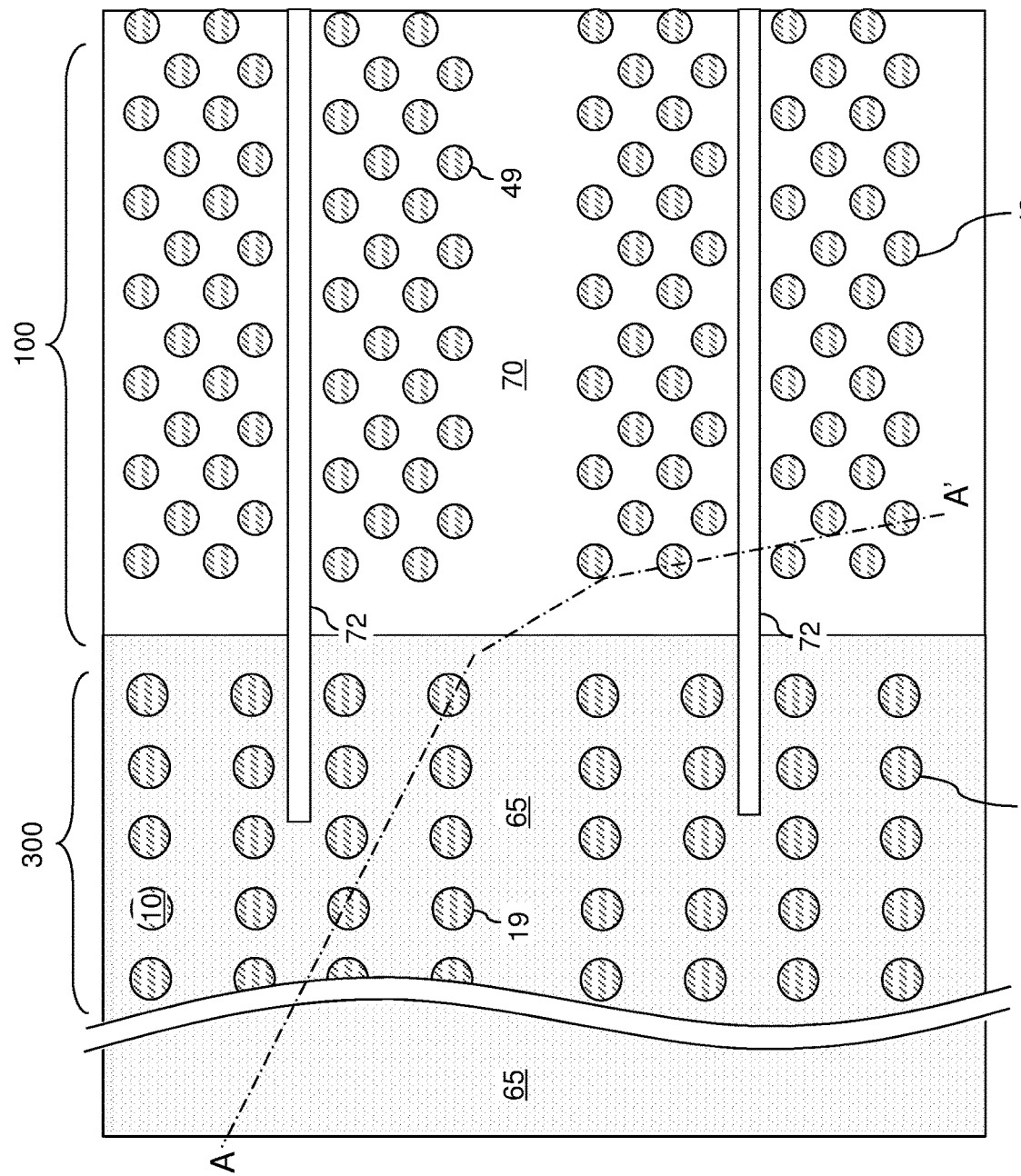
FIG. 3B is a top-down view of the exemplary structure of FIG. 3A. The vertical plane A-A' is the plane of the cross-section for FIG. 3A.

Referring to FIGS. 3A and 3B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 4A-4H illustrate structural changes in a memory opening 49, which is one of the memory openings 49 in the exemplary structure of FIGS. 3A and 3B. The same structural change occurs simultaneously in each of the other memory openings 49 and in each support opening 19.

Referring to FIG. 4A, a memory opening 49 in the exemplary device structure of FIGS. 3A and 3B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 4B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 4D:
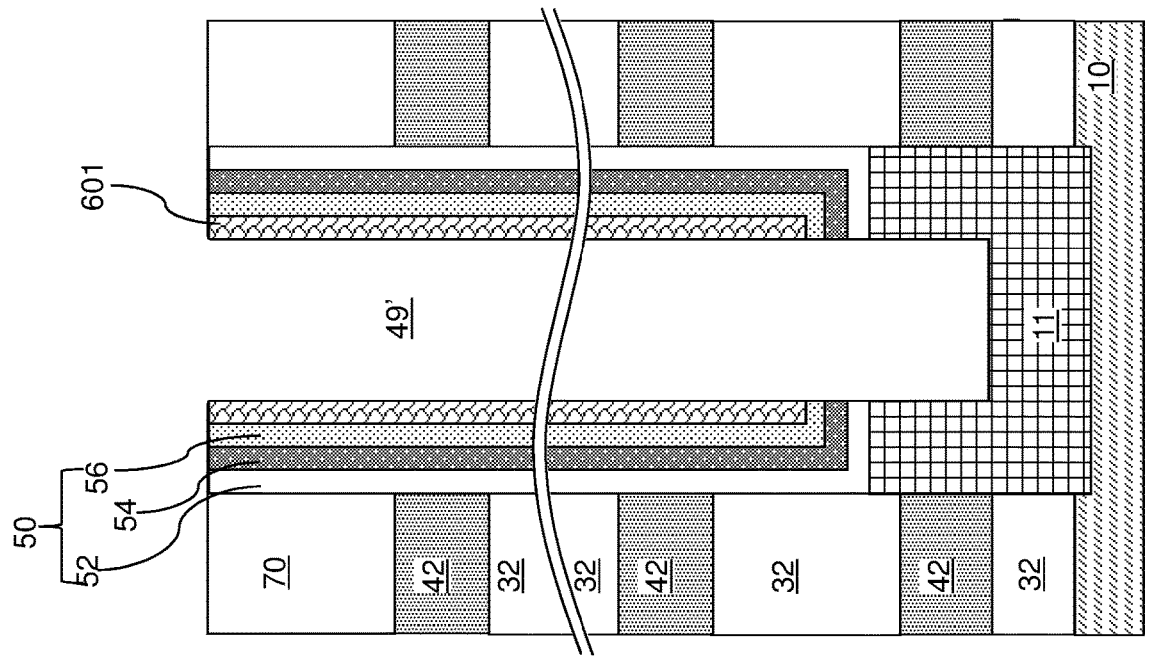
Figure 4C:
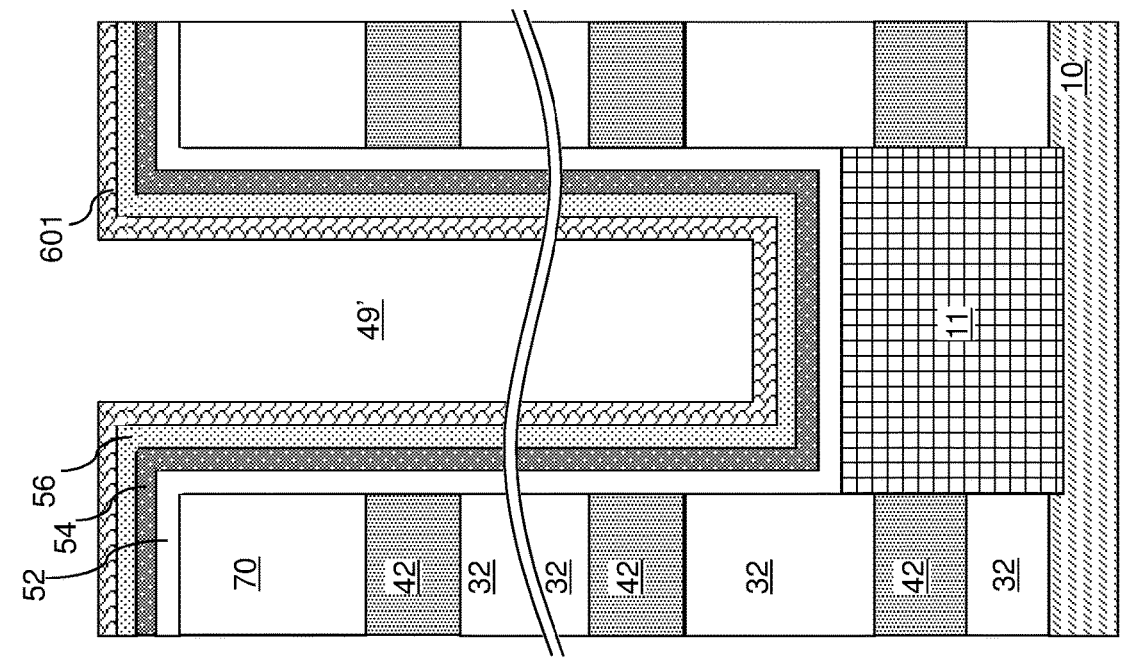

Referring to FIG. 4C, a stack of layers including a blocking dielectric layer 52, a charge storage layer 54, a tunneling dielectric 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the descriptions in the present disclosure use an embodiment in which the charge storage layer 54 is a single continuous layer, in other embodiments the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric 56 can include a stack of a first silicon oxide layer, a silicon oxynitride layer, and a second silicon oxide layer, which is commonly known as an ONO stack. In one embodiment, the tunneling dielectric 56 can include a silicon oxide layer that is substantially free of carbon or a silicon oxynitride layer that is substantially free of carbon. The thickness of the tunneling dielectric 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Referring to FIG. 4D, the optional first semiconductor channel layer 601, the tunneling dielectric 56, the charge storage layer 54, the blocking dielectric layer 52 are sequentially anisotropically etched using at least one anisotropic etch process. The portions of the first semiconductor channel layer 601, the tunneling dielectric 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric 56, the charge storage layer 54, and the blocking dielectric layer 52 at a bottom of each memory cavity 49' can be removed to form openings in remaining portions thereof. Each of the first semiconductor channel layer 601, the tunneling dielectric 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) can be physically exposed underneath the opening through the first semiconductor channel layer 601, the tunneling dielectric 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric 56 is located over the charge storage layer 54. A set of a blocking dielectric layer 52, a charge storage layer 54, and a tunneling dielectric 56 in a memory opening 49 constitutes a memory film 50, which includes a plurality of charge storage regions (comprising the charge storage layer 54) that are insulated from surrounding materials by the blocking dielectric layer 52 and the tunneling dielectric 56. In one embodiment, the first semiconductor channel layer 601, the tunneling dielectric 56, the charge storage layer 54, and the blocking dielectric layer 52 can have vertically coincident sidewalls.

Referring to FIG. 4E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 4F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 4G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can use a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric 56 is surrounded by a charge storage layer 54, and laterally surrounds a portion of the vertical semiconductor channel 60. Each adjoining set of a blocking dielectric layer 52, a charge storage layer 54, and a tunneling dielectric 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 4H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 5:
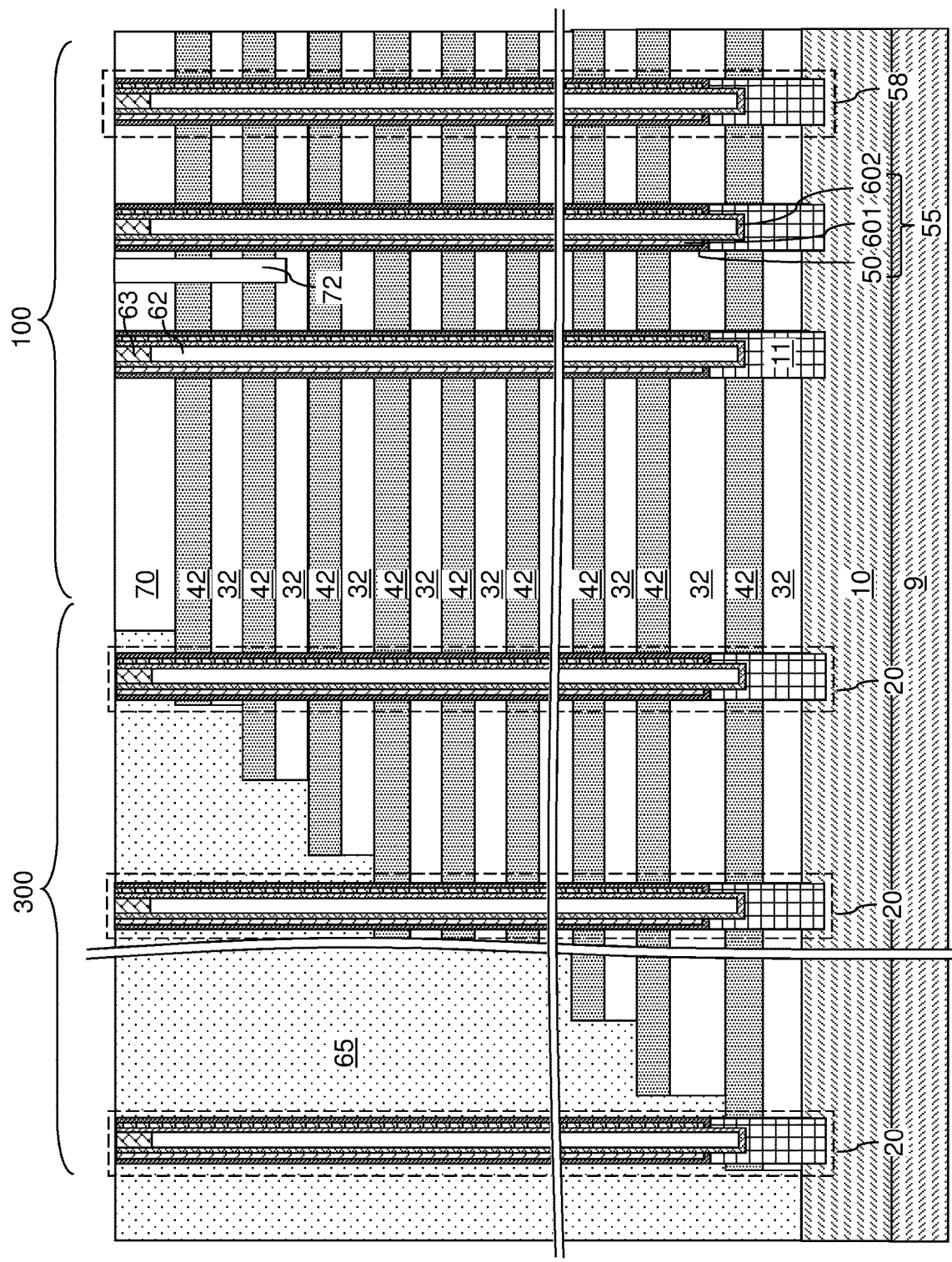
FIG. 5 is a schematic vertical cross-sectional view of the exemplary structure after formation of memory stack structures and support pillar structures according to an embodiment of the present disclosure.

Referring to FIG. 5, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric 56 laterally surrounding the vertical semiconductor channel 60 and a vertical stack of charge storage regions laterally surrounding the tunneling dielectric 56 (as embodied as a charge storage layer 54) and an optional blocking dielectric layer 52. While the descriptions in present disclosure use the illustrated configuration for the memory stack structure, the methods of various embodiments of the present disclosure can be applied to alternative memory stack structures including different layer stacks or structures for the memory film 50 and/or for the vertical semiconductor channel 60.

Figure 6A:
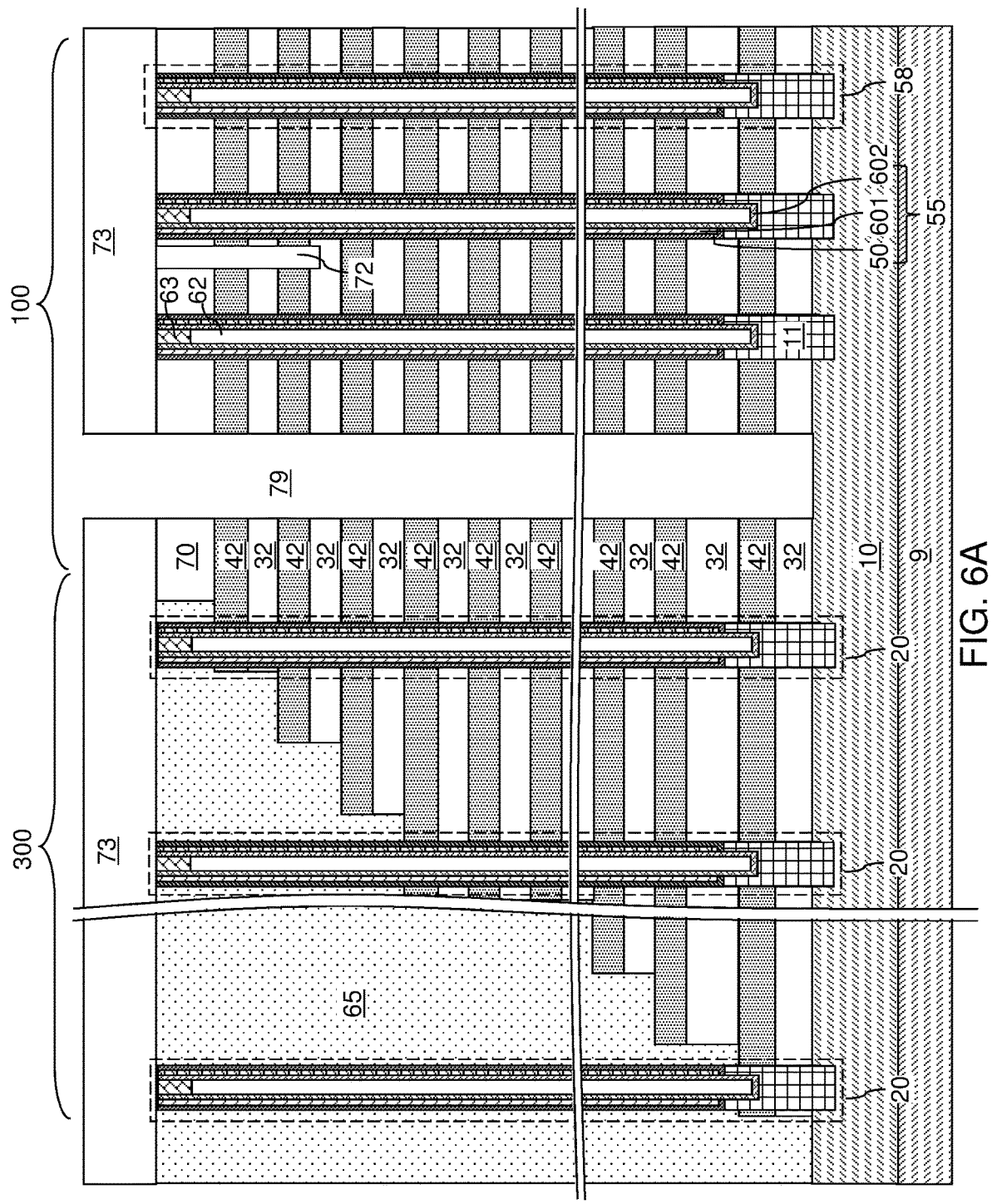
FIG. 6A is a schematic vertical cross-sectional view of the exemplary structure after formation of backside trenches according to an embodiment of the present disclosure.
Figure 6B:
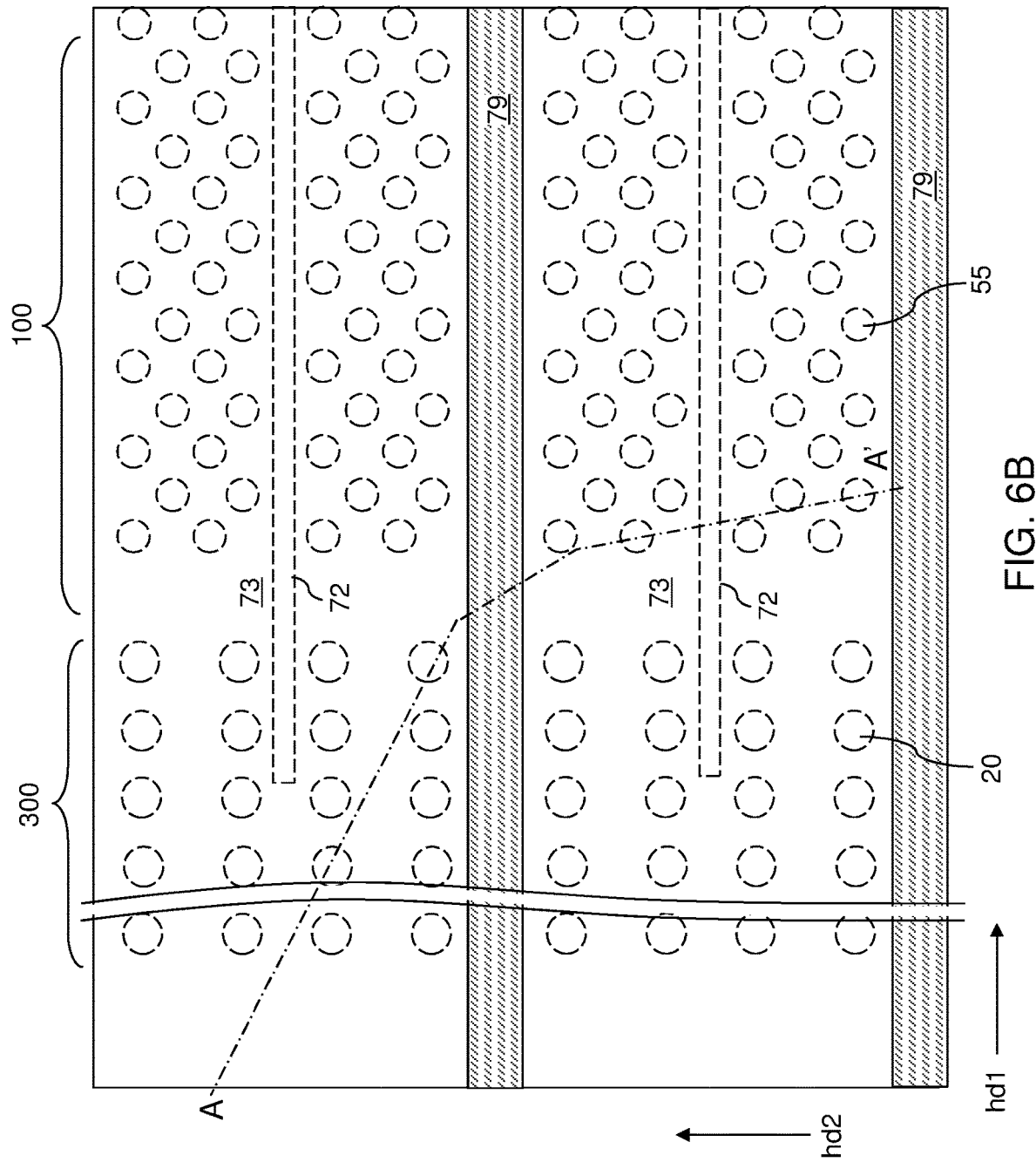
FIG. 6B is a partial see-through top-down view of the exemplary structure of FIG. 6A. The vertical plane A-A' is the plane of the schematic vertical cross-sectional view of FIG. 6A.

Referring to FIGS. 6A and 6B, a lower contact level dielectric layer 73 can be formed over the alternating stack (32, 42) of insulating layer 32 and sacrificial material layers 42, and over the memory stack structures 55 and the support pillar structures 20. The lower contact level dielectric layer 73 includes a dielectric material that is different from the dielectric material of the sacrificial material layers 42. For example, the lower contact level dielectric layer 73 can include silicon oxide. The lower contact level dielectric layer 73 can have a thickness in a range from 50 nm to 500 nm, although lesser and greater thicknesses can also be used.

A photoresist layer (not shown) can be applied over the lower contact level dielectric layer 73, and is lithographically patterned to form openings in areas between clusters of memory stack structures 55. The pattern in the photoresist layer can be transferred through the lower contact level dielectric layer 73, the alternating stack (32, 42) and/or the retro-stepped dielectric material portion 65 using an anisotropic etch to form backside trenches 79, which vertically extend from the top surface of the lower contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact structure can be subsequently formed. The photoresist layer can be removed, for example, by ashing.

Referring to FIGS. 7 and 8A, an etchant that selectively etches the second material of the sacrificial material layers 42 with respect to the first material of the insulating layers 32 can be introduced into the backside trenches 79, for example, using an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 115, and to convert each physically exposed surface portion of the semiconductor material layer 10 into a planar dielectric portion 616. In one embodiment, each tubular dielectric spacer 115 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 115 include a dielectric material that includes the same semiconductor element as the pedestal channel portions 11 and additionally includes at least one non-metallic element such as oxygen and/or nitrogen such that the material of the tubular dielectric spacers 115 is a dielectric material. In one embodiment, the tubular dielectric spacers 115 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 8B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 115 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 8C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Figure 9:
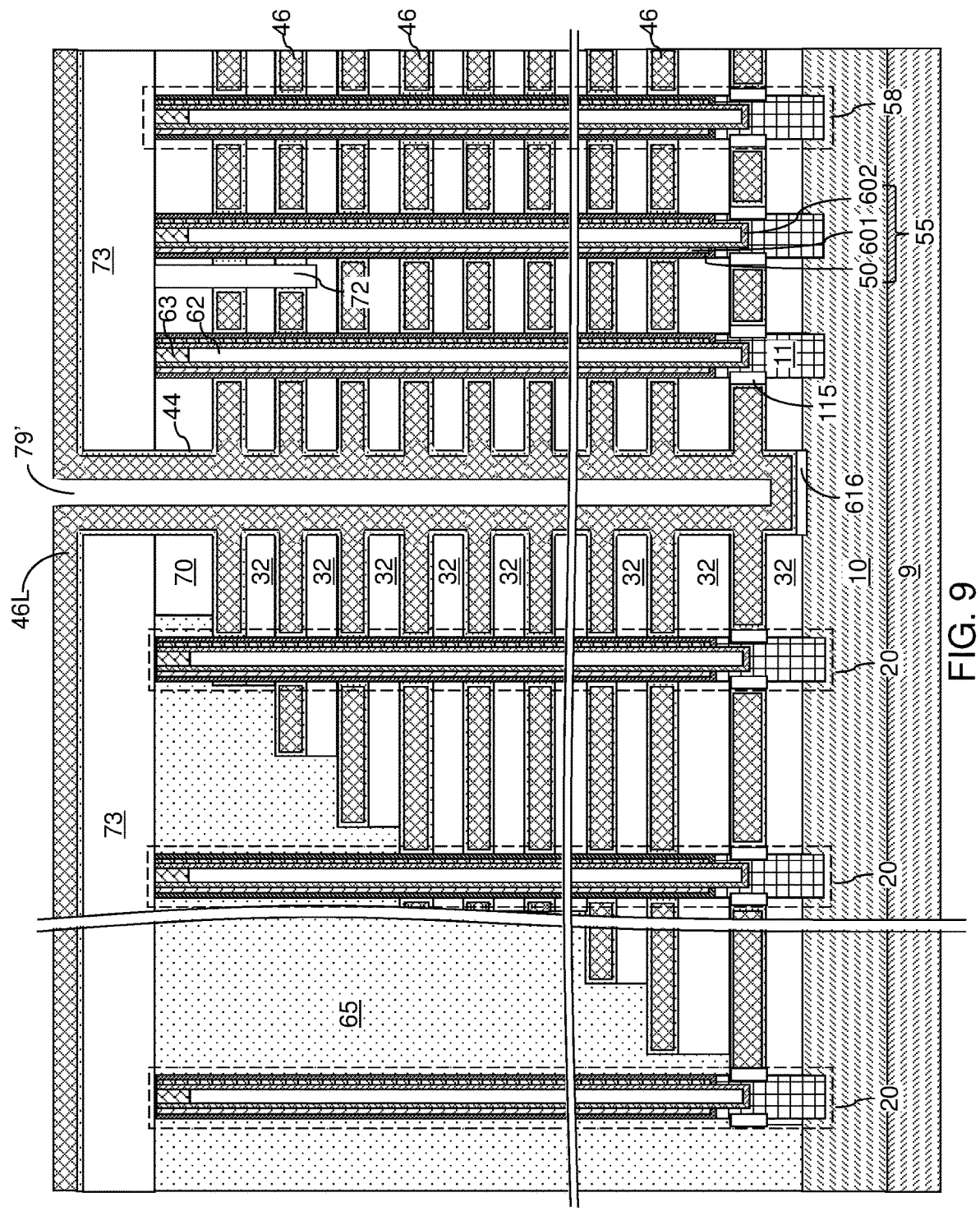
FIG. 9 is a schematic vertical cross-sectional view of the exemplary structure at the processing step of FIG. 8D.

Referring to FIGS. 8D and 9, a metal fill material is deposited in the plurality of backside recesses 43, on the sidewalls of the at least one the backside trench 79, and over the top surface of the lower contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the lower contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the lower contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 115 laterally surrounds a pedestal channel portion 11. A bottommost electrically conductive layer 46 laterally surrounds each tubular dielectric spacer 115 upon formation of the electrically conductive layers 46.

Figure 10A:
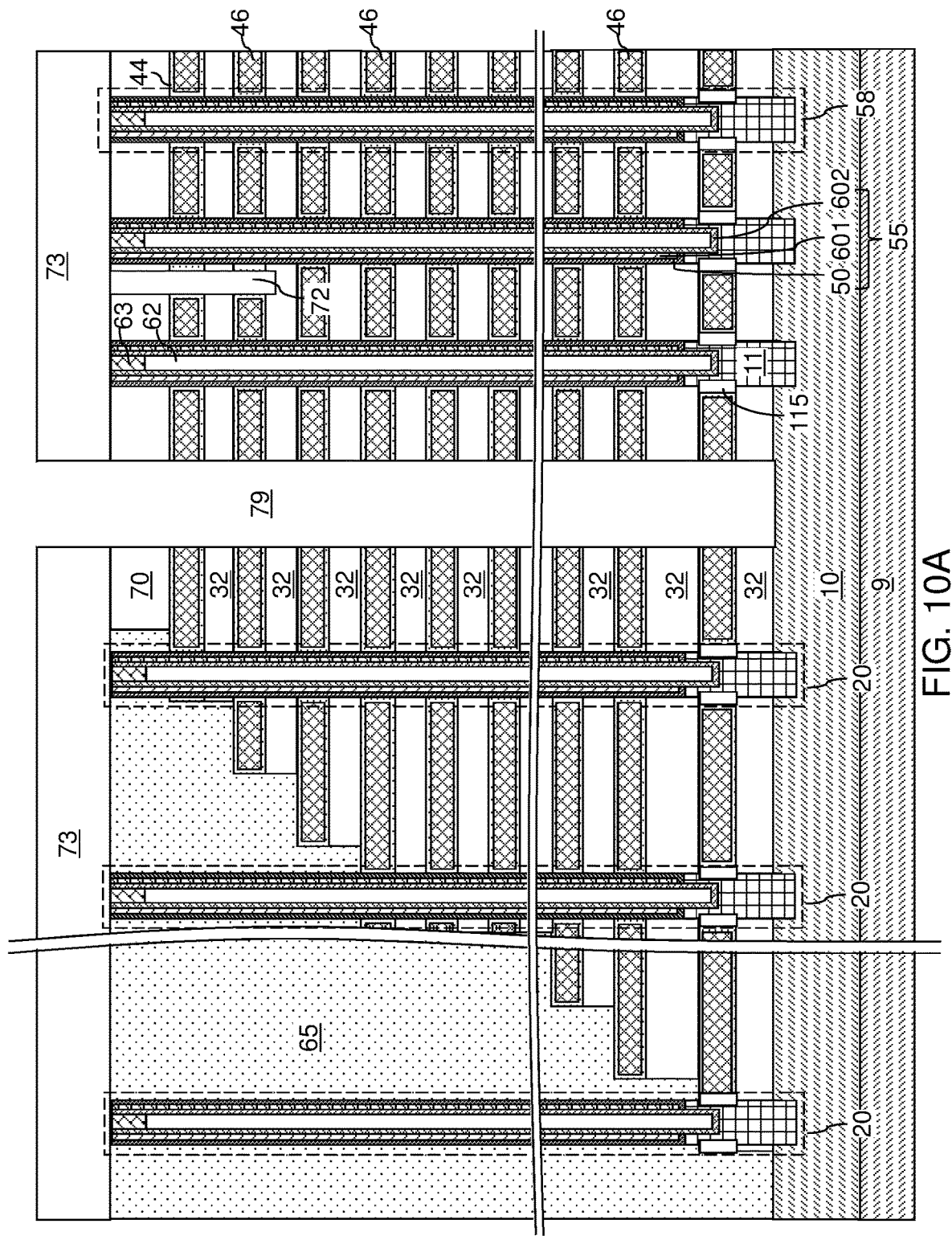
FIG. 10A is a schematic vertical cross-sectional view of the exemplary structure after removal of a deposited conductive material from within the backside trench according to an embodiment of the present disclosure.
Figure 10B:
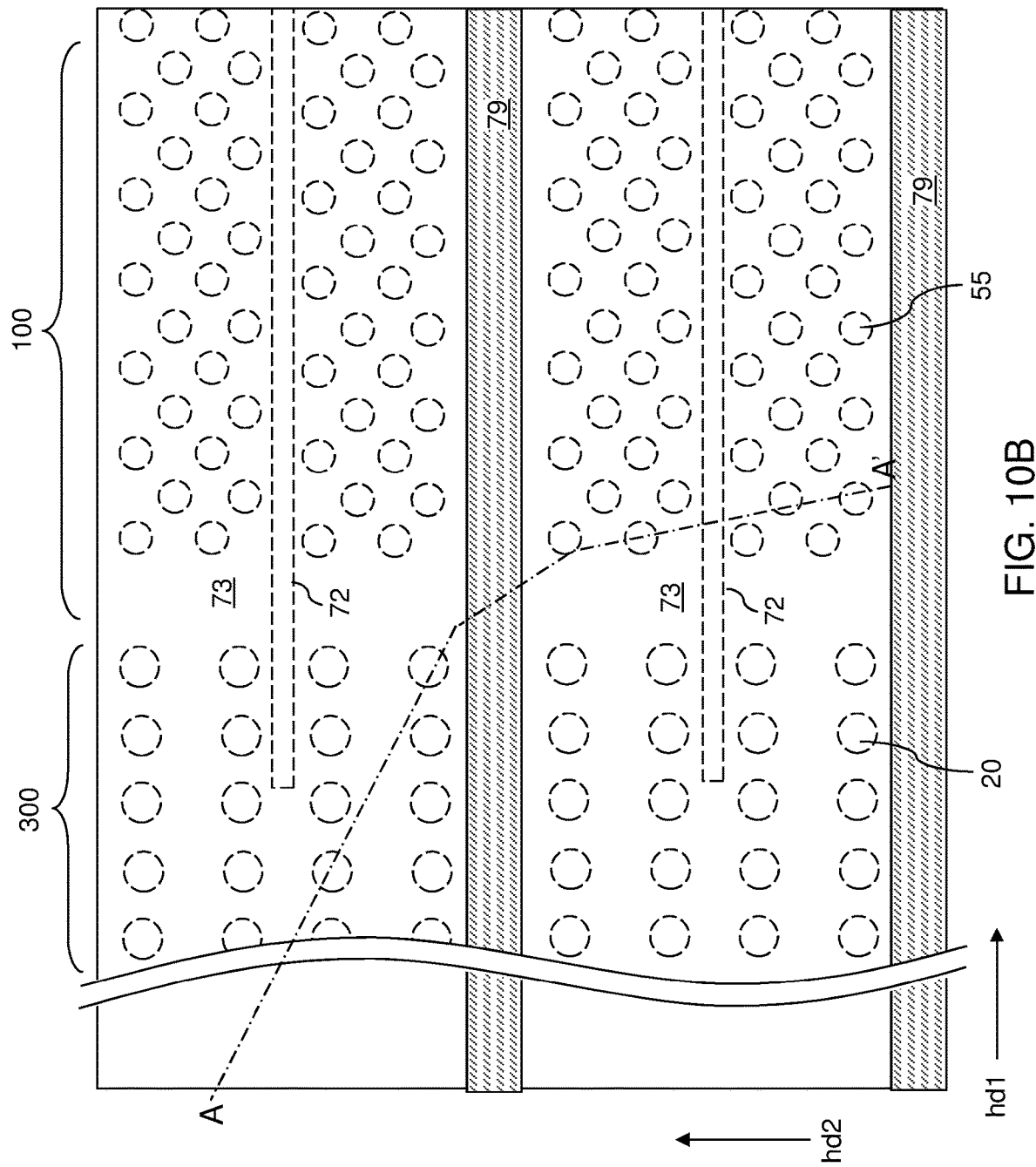
FIG. 10B is a top-down view of the exemplary structure of FIG. 10A.

Referring to FIGS. 10A and 10B, the deposited metallic material of the continuous electrically conductive material layer 46L is etched back from the sidewalls of each backside trench 79 and from above the lower contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

Figure 11A:
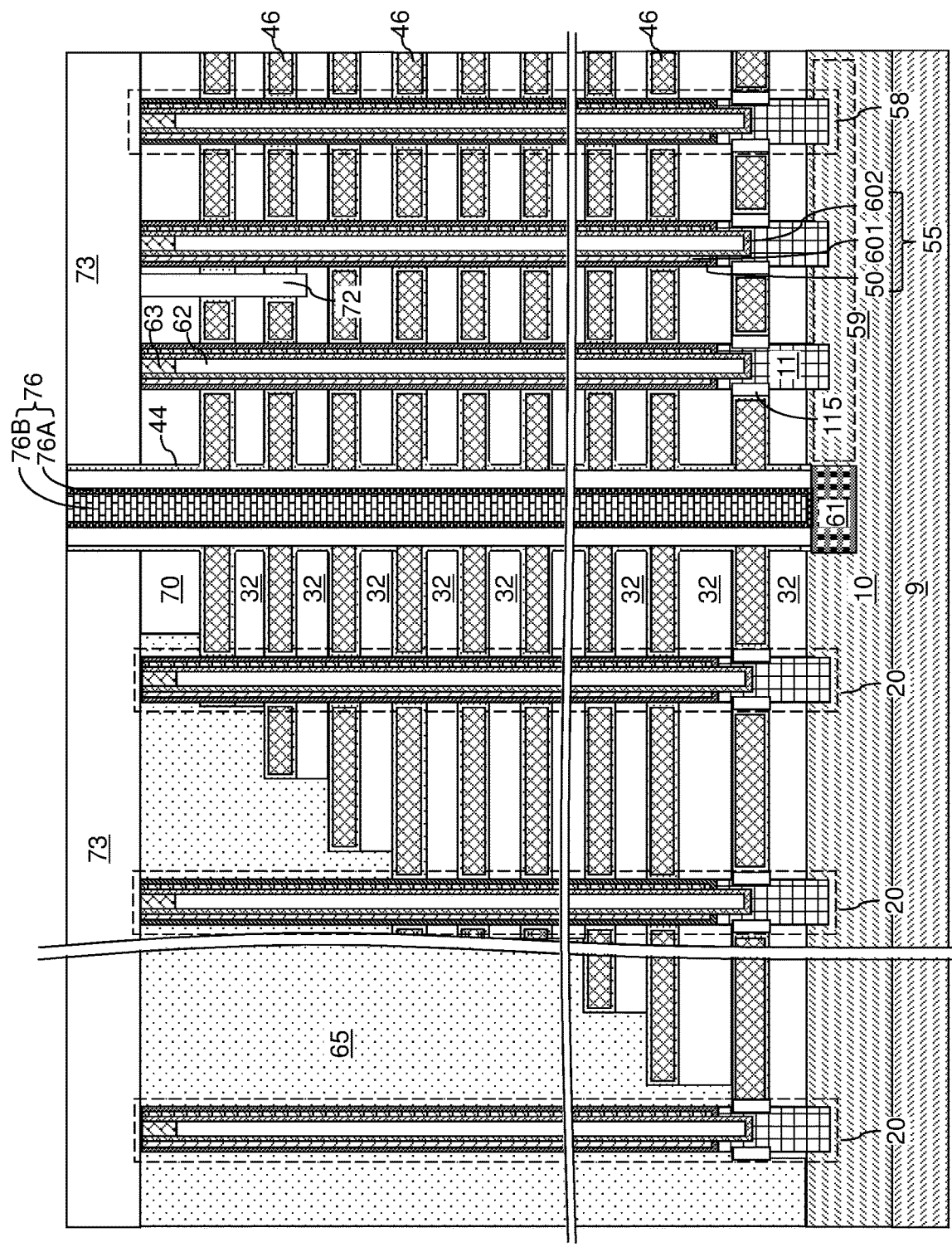
FIG. 11A is a schematic vertical cross-sectional view of the exemplary structure after formation of an insulating spacer and a source contact structure within each backside trench according to an embodiment of the present disclosure.
Figure 11B:
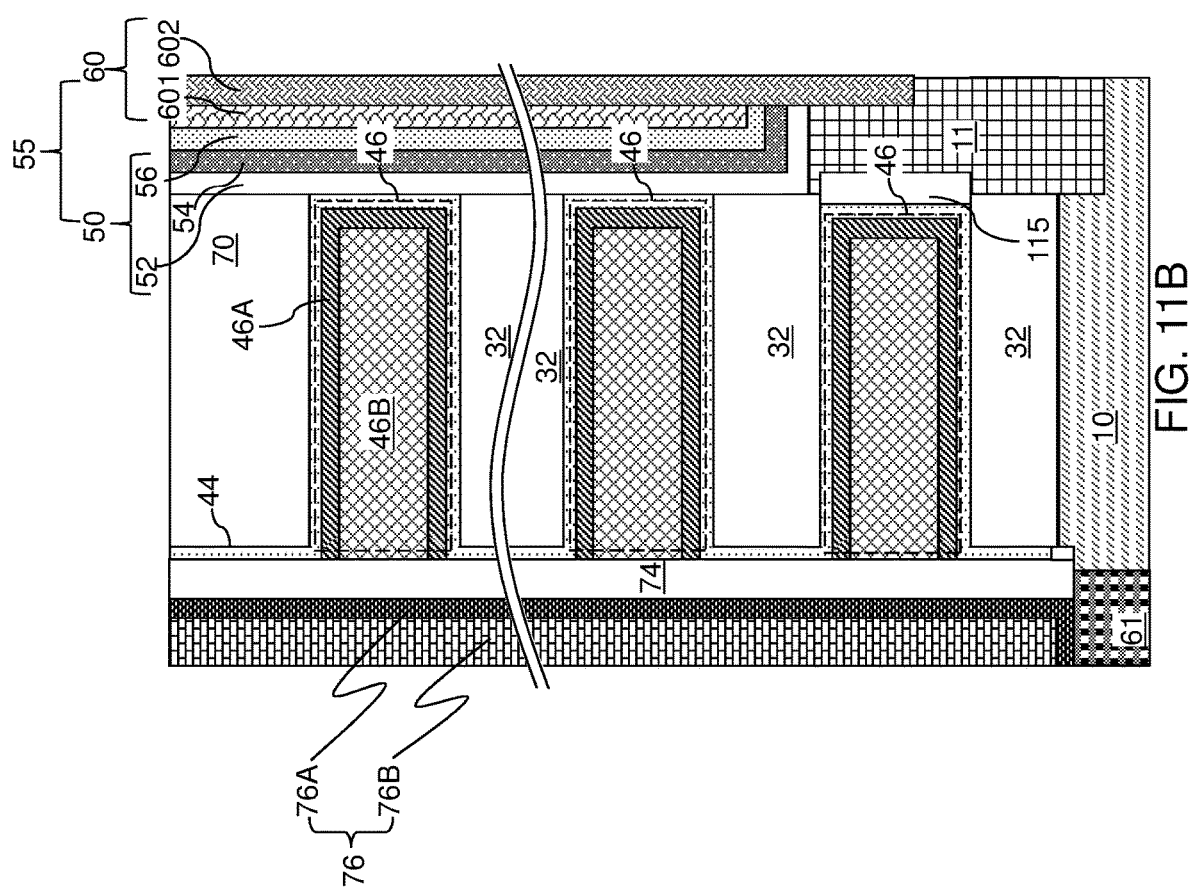
FIG. 11B is a magnified view of a region of the exemplary structure of FIG. 11A.

Referring to FIGS. 11A and 11B, an insulating material layer can be formed in the backside trenches 79 and over the lower contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be used.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not used, the insulating material layer can be formed directly on sidewalls of the insulating layers 32 and directly on sidewalls of the electrically conductive layers 46.

An anisotropic etch is performed to remove horizontal portions of the insulating material layer from above the lower contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A source contact structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be used. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized using the lower contact level dielectric layer 73 overlying the alternating stack (32, 46) as a stopping layer. If chemical mechanical planarization (CMP) process is used, the lower contact level dielectric layer 73 can be used as a CMP stopping layer. Each remaining continuous portion of the at least one conductive material in the backside trenches 79 constitutes a source contact structure 76.

The source contact structure 76 extends through the alternating stack (32, 46), and contacts a top surface of the source region 61. If a backside blocking dielectric layer 44 is used, the source contact structure 76 can contact a sidewall of the backside blocking dielectric layer 44.

Figure 12A:
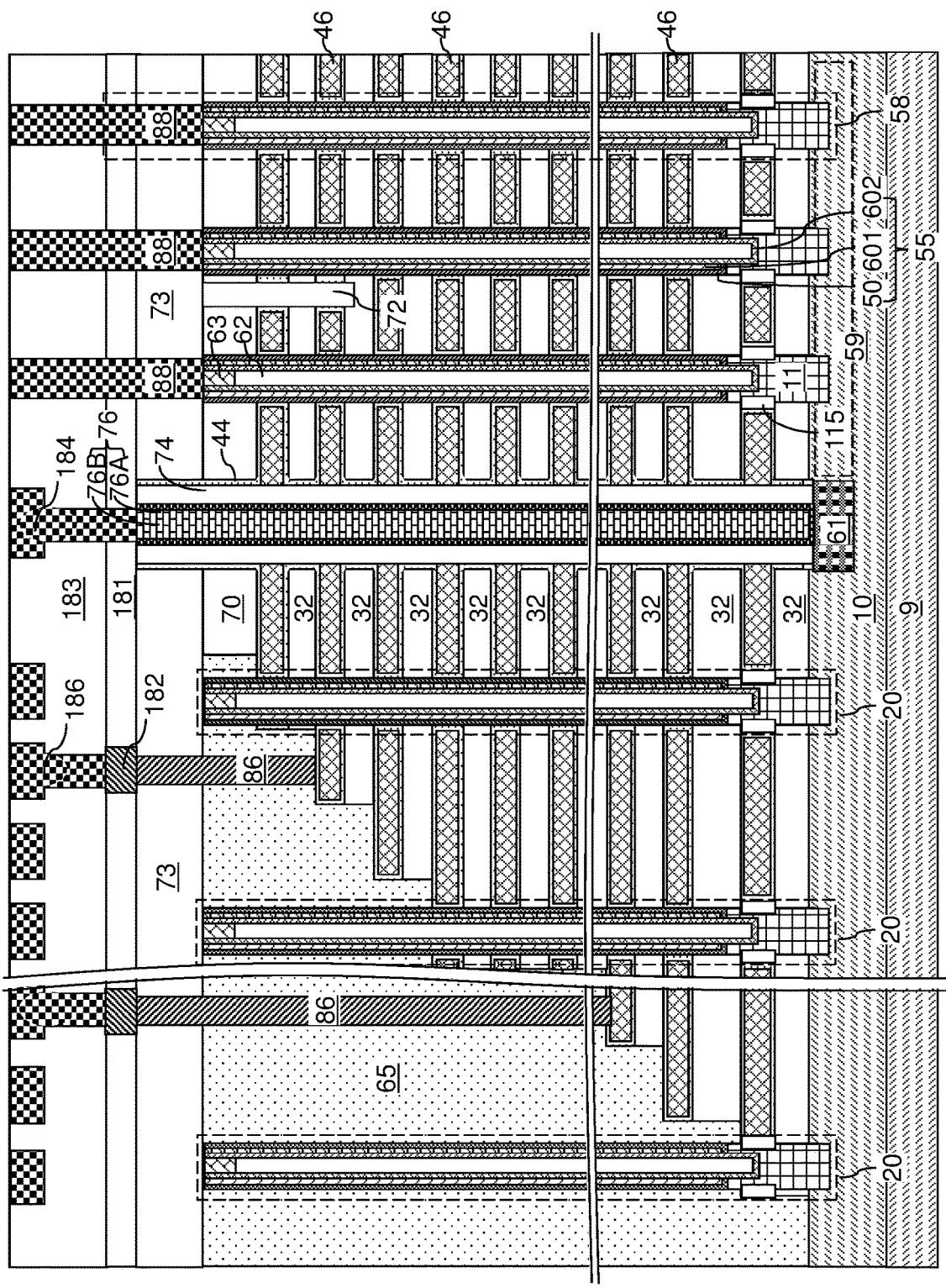
FIG. 12A is a schematic vertical cross-sectional view of the exemplary structure after formation of contact level dielectric material layers and contact via structures according to an embodiment of the present disclosure.
Figure 12B:
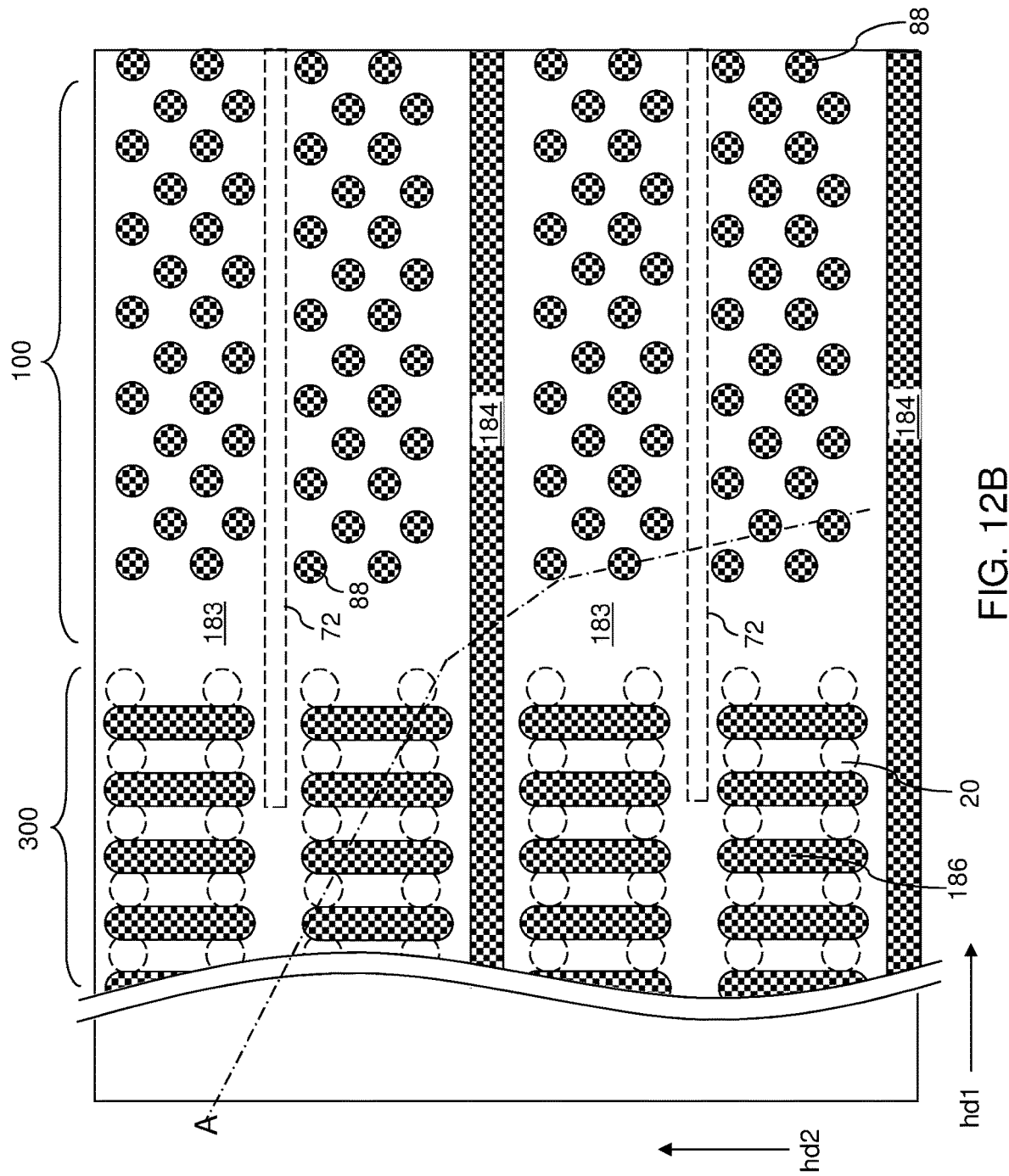
FIG. 12B is a top-down view of the exemplary structure of FIG. 12A. The vertical plane A-A' is the plane of the schematic vertical cross-sectional view of FIG. 12A.

Referring to FIGS. 12A and 12B, layer contact via structures 86 can be formed through the lower contact level dielectric layer 73 and the retro-stepped dielectric material portion 65 to a top surface of a respective one of the electrically conductive layers 46 in the staircase region. The layer contact via structures 86 include word line contact via structures that contact a subset of the electrically conductive layers 46 that functions as word lines. In one embodiment, top surfaces of the layer contact via structures 86 can be coplanar with the top surface of the lower contact level dielectric layer 73.

A middle contact level dielectric layer 181 can be deposited over the lower contact level dielectric layer 73. The middle contact level dielectric layer 181 includes a dielectric material such as silicon oxide. Line trenches can be formed through the middle contact level dielectric layer 181 over the layer contact via structures 86. The line trenches in the middle contact level dielectric layer 181 can be filled with at least one conductive material to form contact-connection line structures 182 that contact a top surface of a respective underlying one of the layer contact via structures 181.

Alternatively, the middle contact level dielectric layer 181 may be formed over the lower contact level dielectric layer 73 prior to formation of the layer contact via structures 86, and integrated line and via cavities can be formed through the middle contact level dielectric layer 181 and the lower contact level dielectric layer 73. Each integrated line and via cavity can include a combined volume for a layer contact via structure 86 and a contact-connection line structure 182. The integrated line and via cavities are filled with at least one conductive material to form integrated line and via structures. Each integrated line and via structure can include a combination of a layer contact via structure 86 and a contact-connection line structure 182, An upper contact level dielectric layer 183 can be formed over the middle contact level dielectric layer 181. The upper contact level dielectric layer 183 includes a dielectric material such as silicon oxide. Contact via cavities extending through the upper contact level dielectric layer 183, optionally through the middle contact level dielectric layer 181, and optionally through the lower contact level dielectric layer 73 can be formed, for example, by application and patterning of a photoresist layer over the upper contact level dielectric layer 183, and by an anisotropic etch process that transfers the pattern in the photoresist layer through underlying portions of the upper contact level dielectric layer 183, the middle contact level dielectric layer 181, and the lower contact level dielectric layer 73. The contact via cavities can be formed over the memory opening fill structures 58, the source contact structures 76, and the contact-connection line structure 182, which can function as etch stop structures during formation of the contact via cavities. The photoresist layer can be removed, for example, by ashing.

Optionally, a line pattern can be formed in an upper region of a subset of the contact via cavities. For example, a photoresist layer can be applied over the upper contact level dielectric layer 183, and can be lithographically patterned to form line-shaped openings that overlie the subset of the contact via cavities. The pattern in the photoresist layer can be transferred into the upper region of the upper contact level dielectric layer 183 by an anisotropic etch process. Integrated line and via cavities may be formed through the upper contact level dielectric layer 183. In one embodiment, the integrated line and via cavities can be formed over the source contact structures 76 and the contact-connection line structure 182. Cylindrical via cavities including vertical sidewalls that extend from the top surface of the upper contact level dielectric layer 183 to the top surface of a respective one of the drain regions 63 can be formed in the memory array region. The photoresist layer can be subsequently removed, for example, by ashing.

At least one conductive material can be deposited in the integrated line and via cavities and the cylindrical via cavities. Various contact via structures (88, 184, 186) can be formed through the upper contact level dielectric layer 183, the middle contact level dielectric layer 181, and the lower contact level dielectric layer 73. The contact via structures (88, 184, 186) can include drain contact via structures 88 that extend through the upper contact level dielectric layer 183, the middle contact level dielectric layer 181, and the lower contact level dielectric layer 73, and contacts a top surface of a respective one of the drain regions 63. Each drain contact via structure 88 can have a cylindrical shape, i.e., a shape having horizontal cross-sectional area that is invariant with translation along the vertical direction. The contact via structures (88, 184, 186) can further include word-line-connection contact via structures 186 that are formed on a top surface of a respective one of the contact-connection line structures 182. Each word-line-connection contact via structure 186 can extend through the upper contact level dielectric layer 183. Further, the contact via structures (88, 184, 186) can further include source-connection contact via structures 184 that are formed on a top surface of a respective one of the source contact structures 76. Each source-connection contact via structure 184 can extend through the upper contact level dielectric layer 183 and the middle contact level dielectric layer 181. In one embodiment, each of the word-line-connection contact via structures 186 and the source-connection contact via structures 184 can be an integrated line and via structure that includes a respective via portion and a respective line portion. In one embodiment, the line portion of each source-connection contact via structure 184 can laterally extend along the first horizontal direction hd1 along a predominant fraction (i.e., more than 50%) of the entire length of an underlying source contact structure 76. A source-connection contact via structure 184 can be formed above, and can be electrically connected to, each source contact structure 76.

Figure 13A:
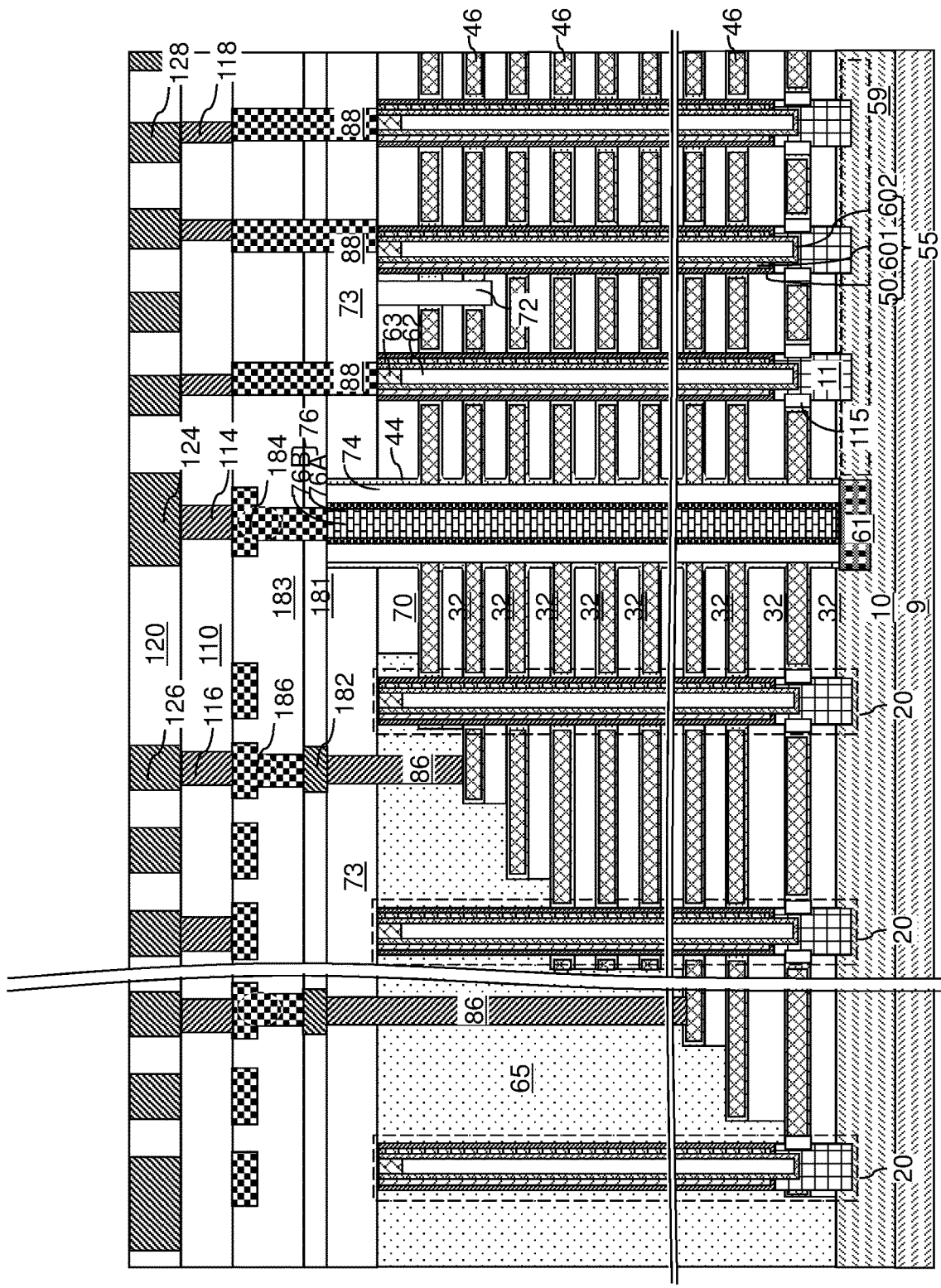
FIG. 13A is a schematic vertical cross-sectional view of the exemplary structure after formation of first-level dielectric material layers and first-level metal interconnect structures according to an embodiment of the present disclosure.
Figure 13B:
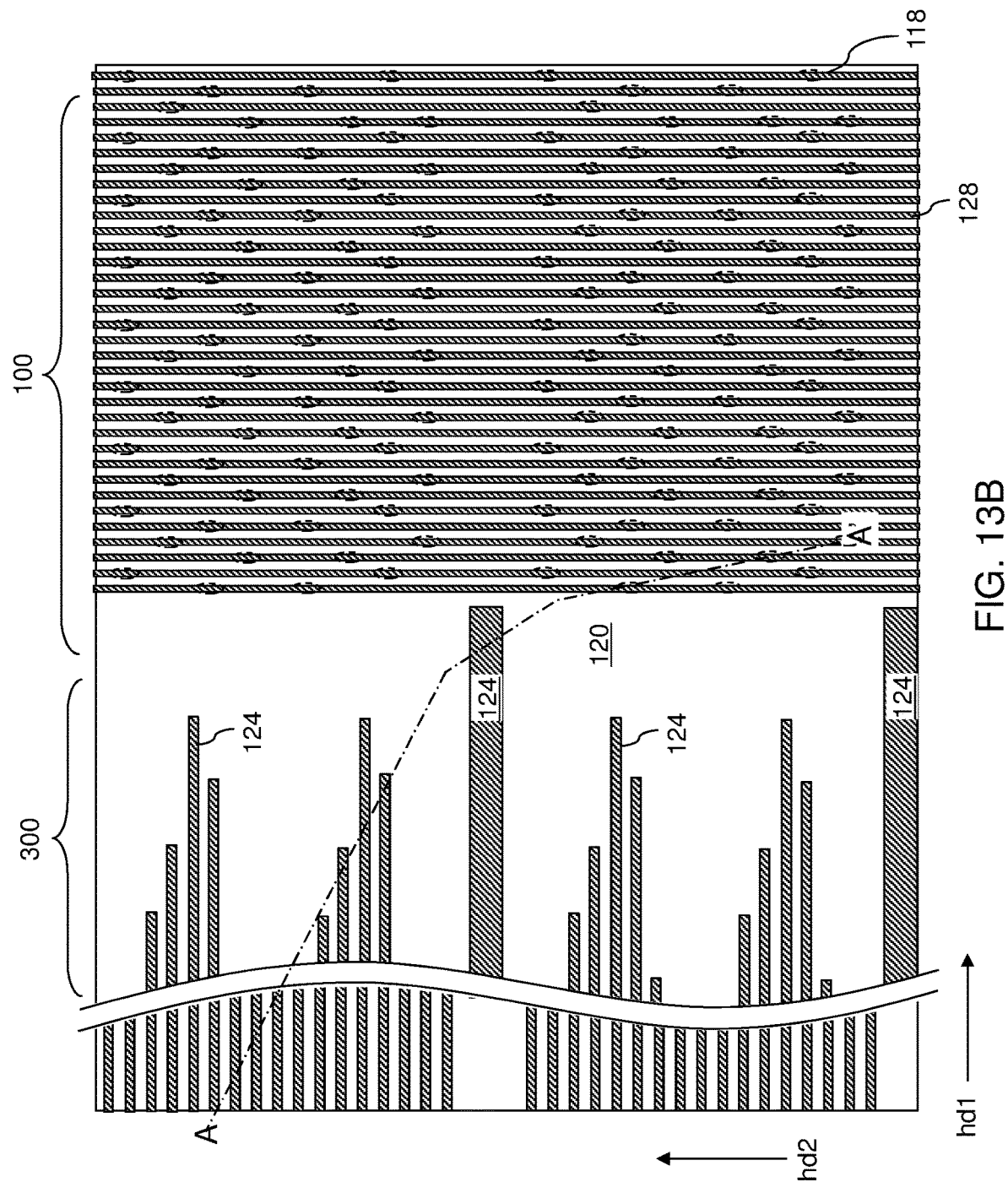
FIG. 13B is a top-down view of the exemplary structure of FIG. 13A. The vertical plane A-A' is the plane of the schematic vertical cross-sectional view of FIG. 13A.

Referring to FIGS. 13A and 13B, a first via level dielectric layer 110 can be deposited over the upper contact level dielectric layer 183. The first via level dielectric layer 110 includes a dielectric material such as undoped silicate glass, a doped silicate glass, or an organosilicate glass. The thickness of the first via level dielectric layer 110 can be in a range from 50 nm to 300 nm, although lesser and greater thicknesses can also be employed.

Via cavities are formed through the first via level dielectric layer 110, for example, by application and patterning of a photoresist layer over the first via level dielectric layer 110 and by anisotropically etching unmasked portions of the first via level dielectric layer 110. The photoresist layer can be subsequently removed. A conductive material can be deposited in the via cavities to form various first via structures (118, 114, 116). The first via structures (118, 114, 116) can include bit-line-connection via structures 118 that are formed on a top surface of a respective one of the drain contact via structures 88, first source-connection via structures 114 that are formed on a top surface of a respective one of the source-connection contact via structures 184, and first word-line-connection via structures 116 that are formed on a top surface of a respective one of the word-line-connection contact via structures 186.

A first line level dielectric layer 120 can be deposited over the first via level dielectric layer 110. The first line level dielectric layer 120 includes a dielectric material such as undoped silicate glass, a doped silicate glass, or an organosilicate glass. The thickness of the first line level dielectric layer 120 can be in a range from 50 nm to 300 nm, although lesser and greater thicknesses can also be employed.

Line cavities are formed through the first line level dielectric layer 120, for example, by application and patterning of a photoresist layer over the first line level dielectric layer 120 and by anisotropically etching unmasked portions of the first line level dielectric layer 120. The photoresist layer can be subsequently removed. A conductive material can be deposited in the line cavities to form various first line structures (128, 124, 126). The first line structures (128, 124, 126) can include bit lines 128 that are formed on a top surface of a respective one of the bit-line-connection via structures 118, first source-connection line structures 124 that are formed on a top surface of a respective one of the first source-connection via structures 114, and first word-line-connection line structures 126 that are formed on a top surface of a respective one of the first word-line-connection via structures 116.

In one embodiment, the bit lines 128 can laterally extend along the second horizontal direction hd2, and can be laterally spaced apart along the first horizontal direction hd1 with a uniform pitch, which is herein referred to as a bit line pitch. The first source-connection line structures 124 and the first word-line-connection line structures 126 can laterally extend along the first horizontal direction hd1, and can be formed in the staircase region 300. Each source region 61 can be electrically connected to a respective set of at least one first source-connection line structures 124 through a respective source contact structure 76 and a respective at least one first source-connection via structure 114.

Figure 14A:
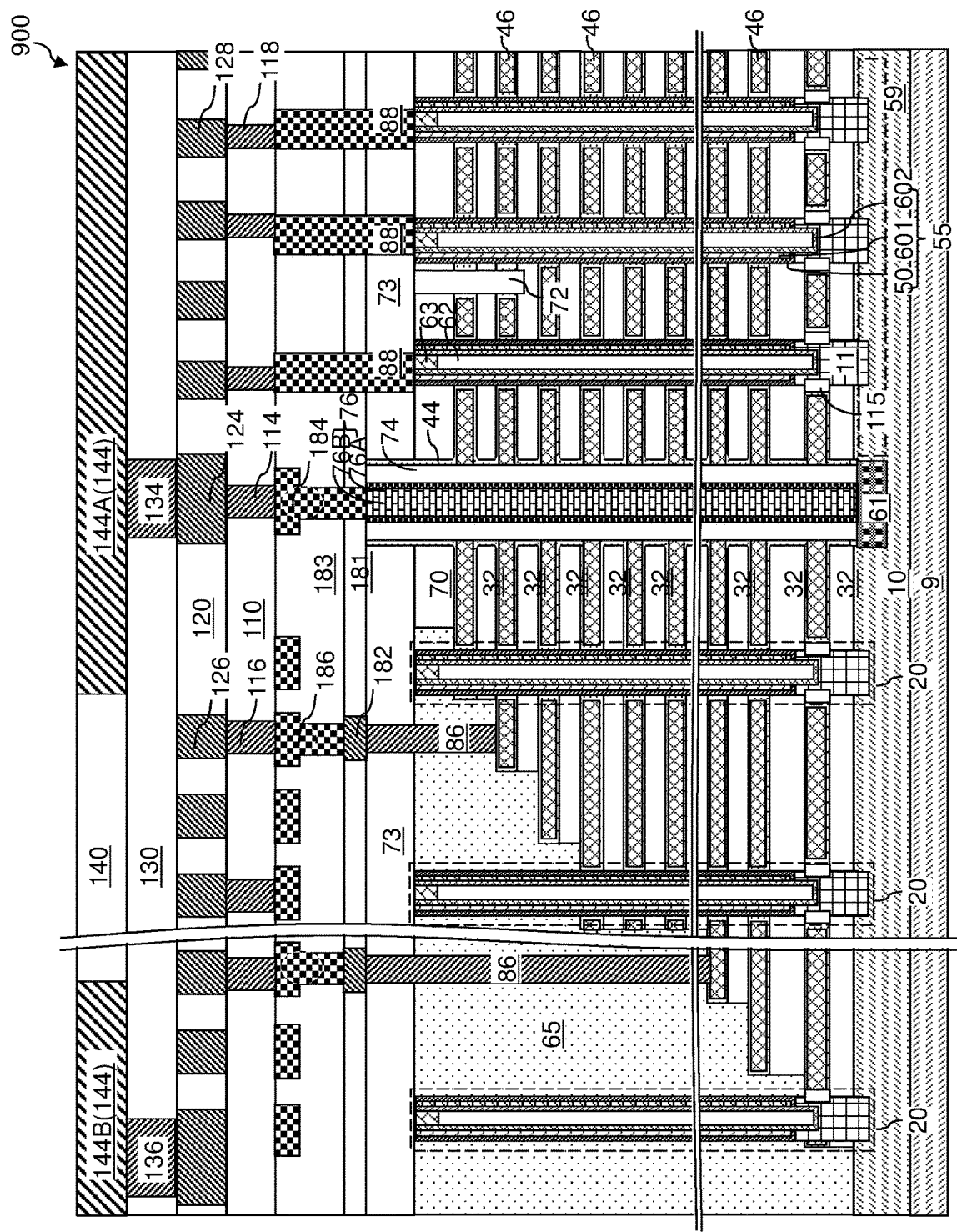
FIG. 14A is a schematic vertical cross-sectional view of a first configuration of the exemplary structure after formation of pad connection via structures and memory-side bonding pads according to an embodiment of the present disclosure.
Figure 14B:
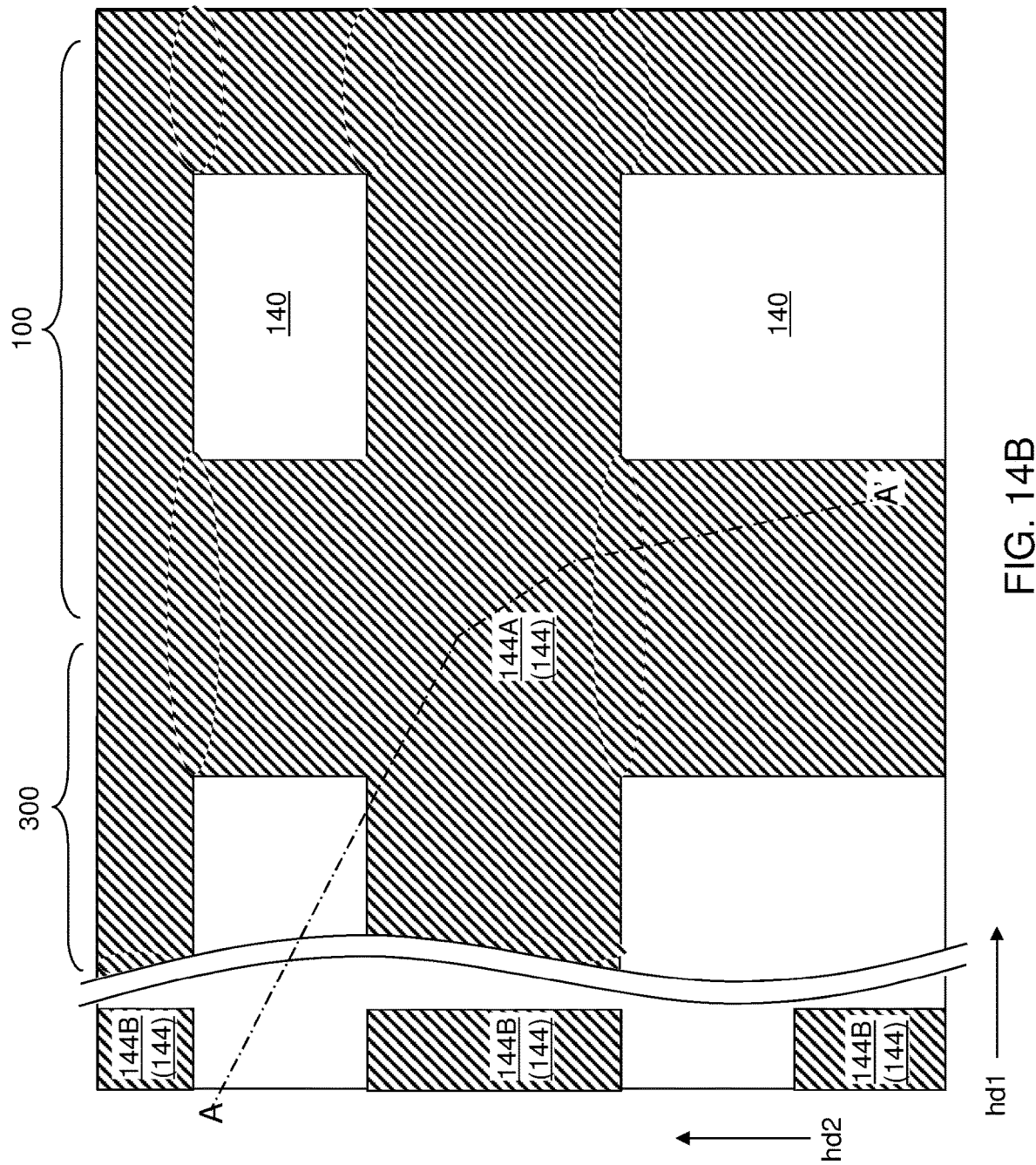
FIG. 14B is a top-down view of a region of the first configuration of the exemplary structure of FIG. 14A.
Figure 14C:
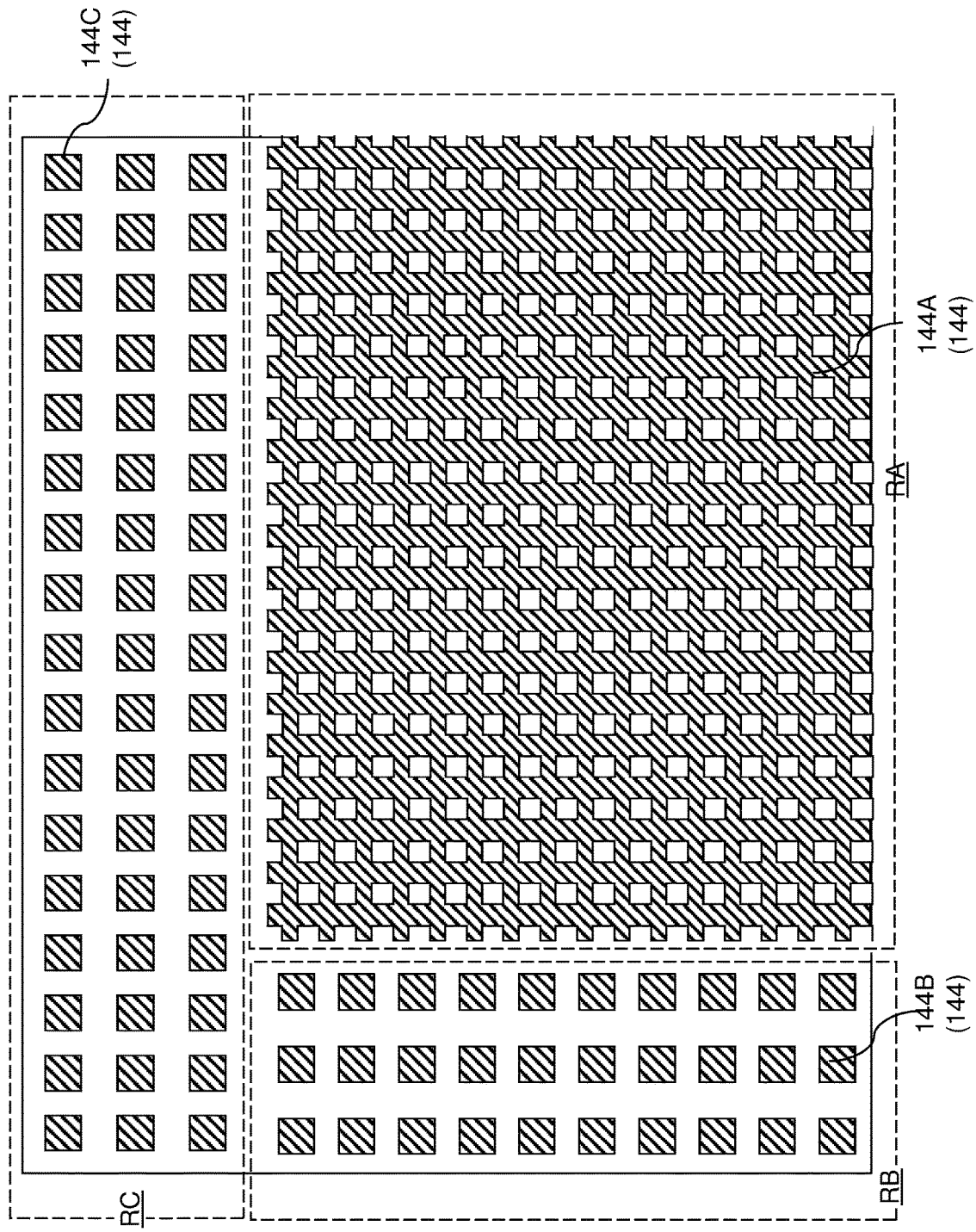
FIGS. 14C and 14D are top-down view of a larger region of the alternative embodiments of the first configuration of the exemplary structure of FIGS. 14A and 14B.
Figure 14D:
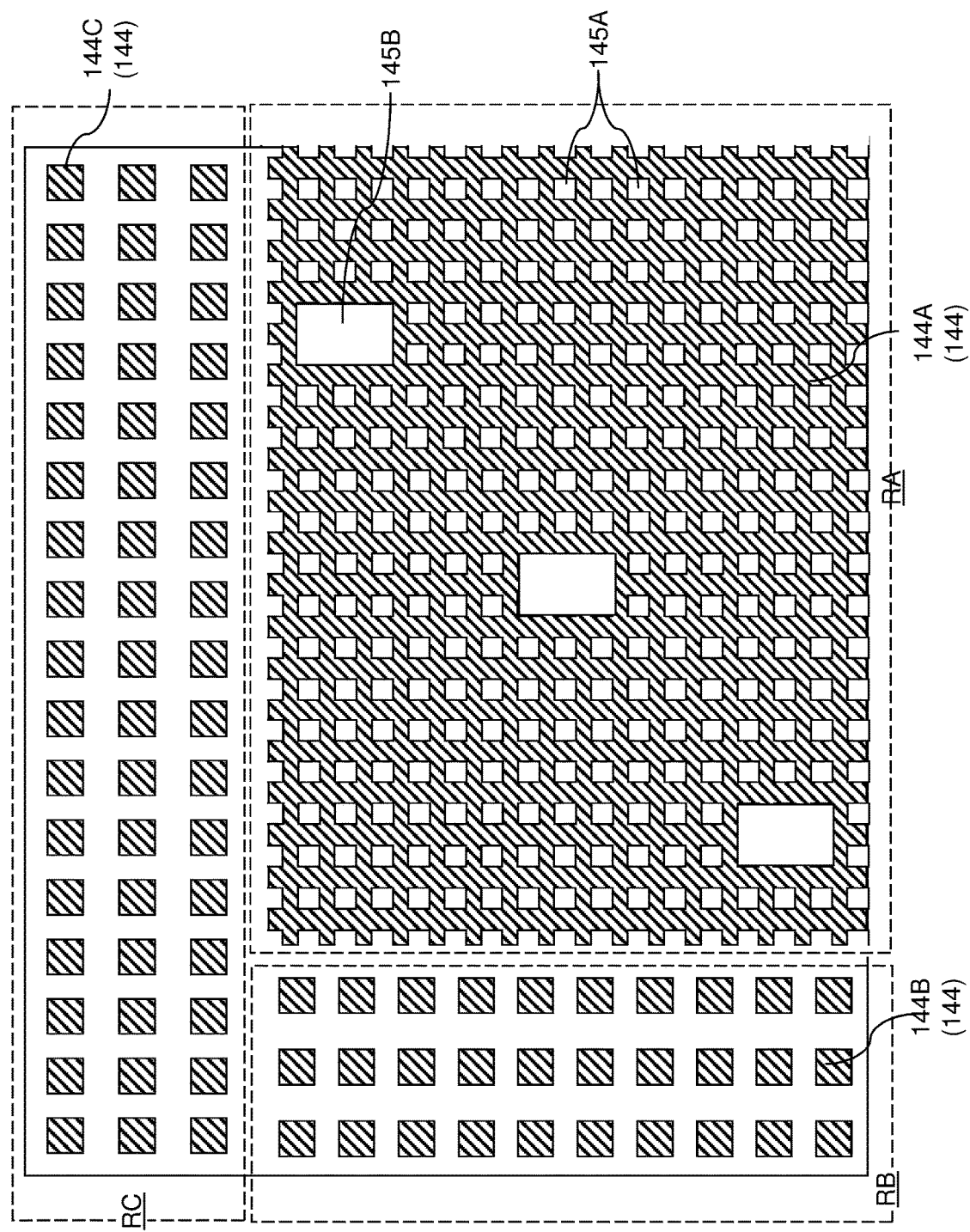
Figure 14E:
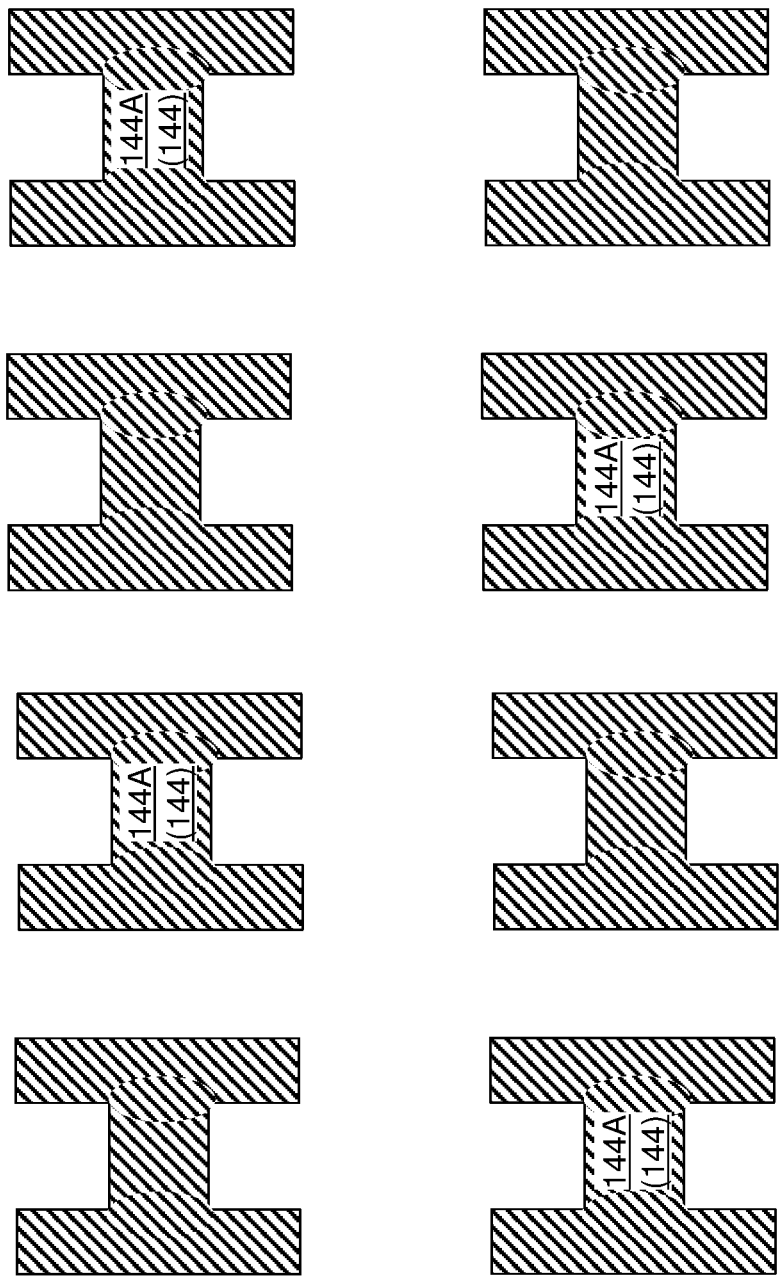
FIG. 14E is a top-down view of a region of a second configuration of the exemplary structure after formation of memory-side bonding pads according to an embodiment of the present disclosure.

Referring to FIGS. 14A-14E, a second via level dielectric layer 130 can be deposited over the upper contact level dielectric layer 183. FIGS. 14C and 14D illustrate a first configuration of the exemplary structure of FIGS. 14A and 14B, and FIG. 14E illustrates a second configuration of the exemplary structure of FIGS. 14A and 14B.

The second via level dielectric layer 130 includes a dielectric material such as undoped silicate glass, a doped silicate glass, or an organosilicate glass. The thickness of the second via level dielectric layer 130 can be in a range from 50 nm to 300 nm, although lesser and greater thicknesses can also be employed.

Via cavities are formed through the second via level dielectric layer 130, for example, by application and patterning of a photoresist layer over the second via level dielectric layer 130 and by anisotropically etching unmasked portions of the second via level dielectric layer 130. The photoresist layer can be subsequently removed. A conductive material can be deposited in the via cavities to form second via structures (134, 136). The second via structures (134, 136) can include second source-connection via structures 134 that are formed on a respective one of the first source-connection line structures 124, second word-line-connection via structures 136 that are formed on a respective one of the word-line-connection line structures 126, and bit-line-connection via structures (not shown) that are formed on a top surface of a respective one of the bit lines 128.

A memory-side pad level dielectric layer 140 can be deposited over the second via level dielectric layer 130. The memory-side pad level dielectric layer 140 includes a dielectric material such as undoped silicate glass, a doped silicate glass, or an organosilicate glass. The thickness of the memory-side pad level dielectric layer 140 can be in a range from 50 nm to 300 nm, although lesser and greater thicknesses can also be employed.

Pad cavities are formed through the memory-side pad level dielectric layer 140, for example, by application and patterning of a photoresist layer over the memory-side pad level dielectric layer 140 and by anisotropically etching unmasked portions of the memory-side pad level dielectric layer 140. The photoresist layer can be subsequently removed. The pad cavities can have a rectangular shape and can be arranged in a rectangular periodic array, or can have a non-rectangular shape such as a "H-shape," and can be arranged in a periodic array which may, or may not, be a rectangular array.

A conductive material can be deposited in the pad cavities to form various memory-side bonding pads 144. The memory-side bonding pads 144 can include at least one source-network memory-side bonding pad 144A that is formed on a top surface of a respective one of the second source-connection via structures 134, word-line-connection memory-side bonding pads 144B that are formed on a top surface of a respective one of the second word-line-connection via structures 136, and bit-line-connection memory-side bonding pads 144C that are formed on a top surface of a respective one of the bit-line-connection via structures. The at least one source-network memory-side bonding pad 144A can be formed in a first area RA that overlies the memory array region 100. The at least one source-network memory-side bonding pad 144A can be formed as a single continuous mesh structure or as a first periodic two-dimensional array, and can be employed as components of a power distribution network for supplying power to the source regions 61. An array of word-line-connection memory-side bonding pads 144B can be formed in a second area RB that overlies the staircase region 300. The array of word-line-connection memory-side bonding pads 144B can be formed as a second periodic two-dimensional array. Each word-line-connection memory-side bonding pad 144B can be electrically connected to a respective one of the electrically conductive layers 46. An array of bit-line-connection memory-side bonding pads 144C can be formed in a third area RC that is laterally offset from the first area RA and the second area RB. Each bit-line-connection memory-side bonding pads 144C can be connected to a respective bit line 128 and a respective subset of the drain regions 63.

The exemplary structure illustrated in FIGS. 9A-9D includes a memory die 900. Generally, the memory die 900 can include an alternating stack of insulating layers 32 and electrically conductive layers 46 located over a substrate (9, 10), memory stack structures 55 extending through the alternating stack (32, 46), wherein each of the memory stack structures 55 comprises a memory film 50 and a vertical semiconductor channel 60, source regions 61 located on, or in, the substrate (9, 10), source contact structures 76 vertically extending through the alternating stack (32, 46) and contacting the source regions 61, and at least one source-network memory-side bonding pad 144A electrically connected to the source contact structures 76 through a subset of memory-side metal interconnect structures, which can include source-connection contact via structures 184, first source-connection via structures 114, first source-connection line structures 124, and second source-connection via structures 134.

Figure 15B:
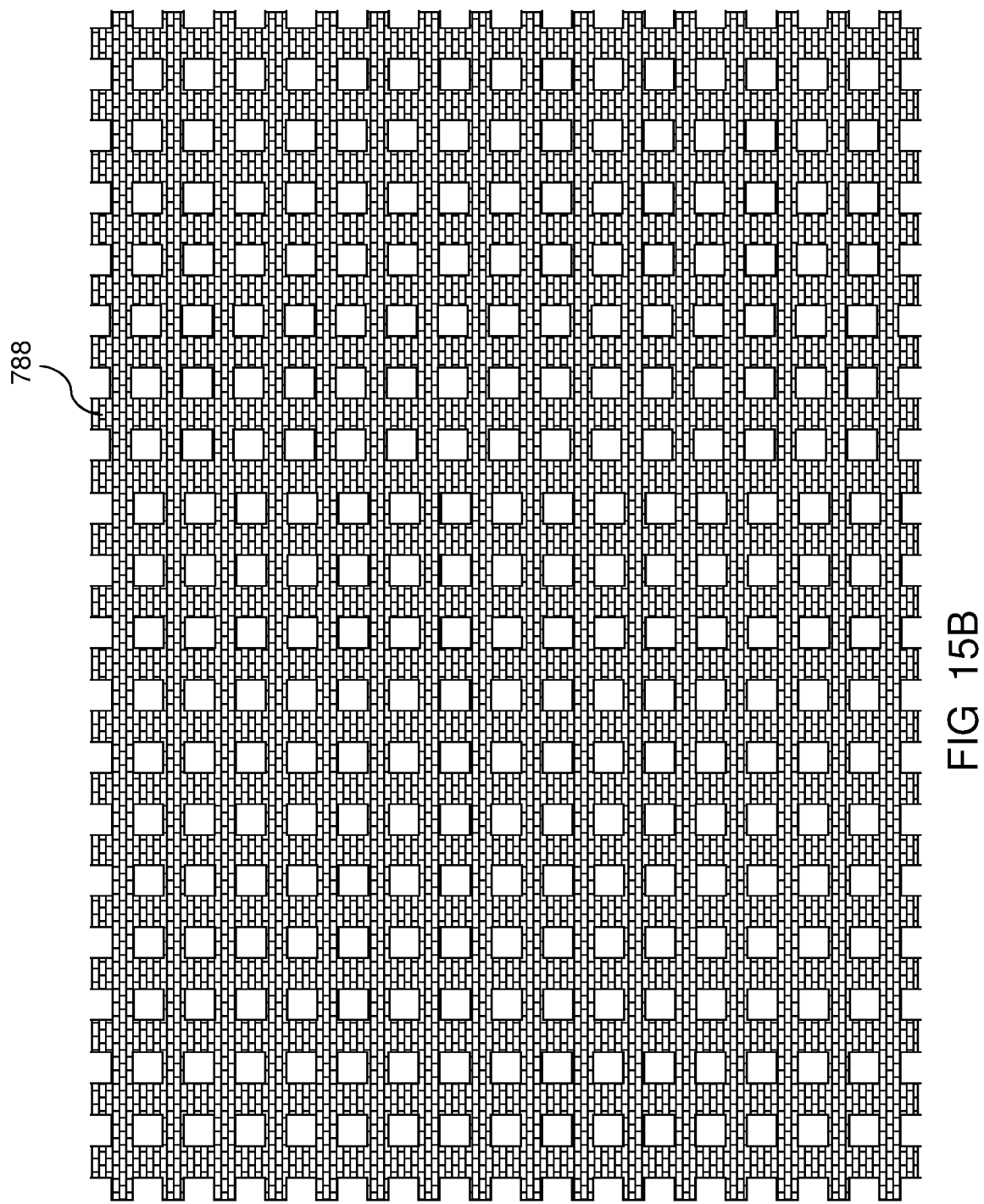
FIG. 15B is a layout of the logic-side bonding pad in the first configuration of the bonded assembly of FIG. 15A.
Figure 16A:
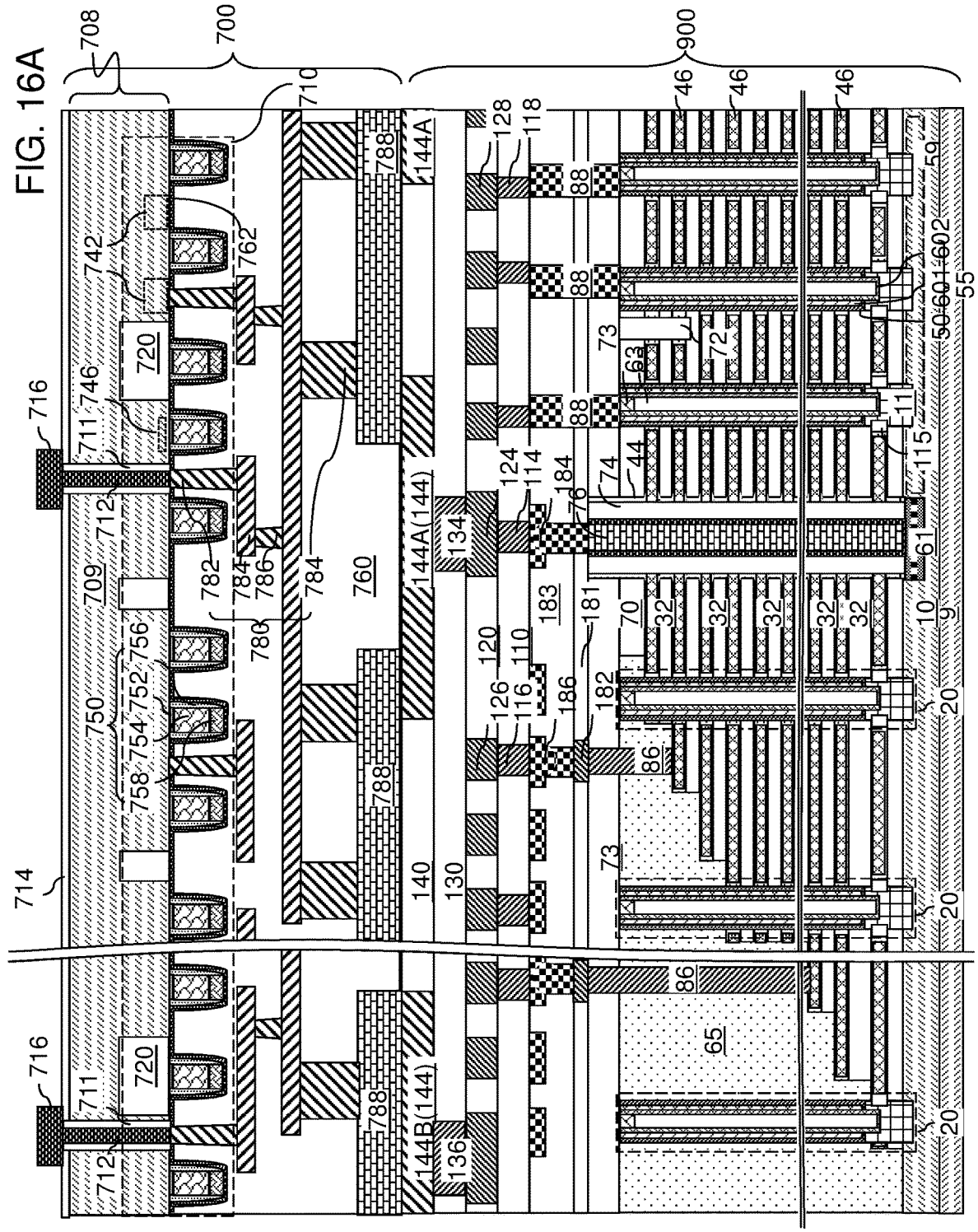
FIG. 16A is a vertical cross-sectional view of a second configuration of a bonded assembly of a memory die and a logic die according to an embodiment of the present disclosure.
Figure 16B:
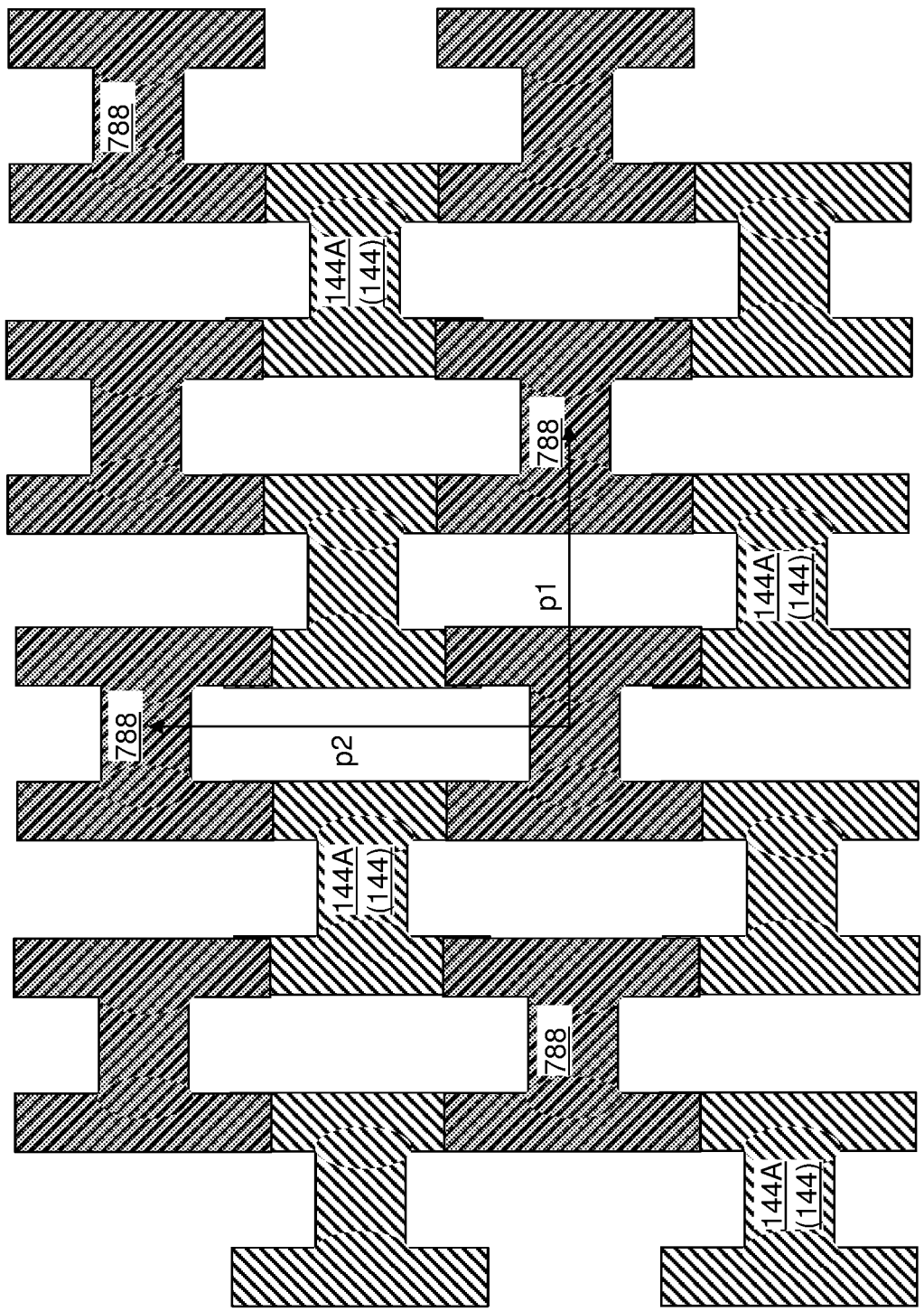
FIG. 16B is a layout of the memory-side bonding pads and the logic-side bonding pads in the second configuration of the bonded assembly of FIG. 16A.

Referring to FIGS. 15A, 15B, 16A, and 16B, a logic die 700 including various semiconductor devices 710 is provided and bonded to the memory die 900 of FIGS. 14A-14E. FIGS. 15A and 15B illustrates a case in which the source-network memory-side bonding pad 144A in the memory die 900 has the first configuration illustrated in FIGS. 14C and 14D. FIGS. 16A and 16B illustrate a case in which the source-network memory-side bonding pads 144A in the memory die 900 has the first configuration illustrated in FIG. 14E. In the exemplary structure illustrated in FIGS. 16A and 16B, the word-line-connection memory-side bonding pads 144B and the bit-line-connection memory-side bonding pads 144C can have the same shape and arrangement as in the layout of FIG. 14C.

The semiconductor devices 710 includes a peripheral circuit for operation of the three-dimensional memory arrays in the memory die 900. The peripheral circuit can include a word line driver that drives word lines of the three-dimensional memory array (as embodied as the electrically conductive layers 46) within the memory die 900, a bit line driver that drives the bit lines 128 in the memory die 900, a word line decoder circuit that decodes the addresses for the electrically conductive layers 46, a bit line decoder circuit that decodes the addresses for the bit lines 128, a sense amplifier circuit that senses the states of memory elements within the memory stack structures 55 in the memory die 900, a source power supply circuit that provides power to source regions 61 the memory die 900, a data buffer and/or latch, or any other semiconductor circuit that can be employed to operate the array of memory stack structures 58 in the memory die 900.

The logic die 700 can include a logic-die substrate 708, which can be a semiconductor substrate. The logic-die substrate 708 can include a substrate semiconductor layer 709. The substrate semiconductor layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 720 can be provided in a surface region of the substrate semiconductor layer 709 to provide electrical isolation among semiconductor devices of the peripheral circuit. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the memory die 900, which are embodied as the electrically conductive layers 46, and source power supply field effect transistors that generate power to be supplied to the source regions 61 the memory die 900

Dielectric material layers are formed over the semiconductor devices 710, which are herein referred to as logic-chip dielectric layers 760. Optionally, a dielectric liner 762 (such as a silicon nitride liner) can be formed to apply mechanical stress to the various field effect transistors and/or to prevent diffusion of hydrogen or impurities from the logic-chip dielectric layers 760 into the semiconductor devices 710. Logic-chip metal interconnect structures 780 are embedded within the logic-chip dielectric layers 760. The logic-chip metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and logic-side bonding pads 788. The logic-side bonding pads 788 are configured to mate with the memory-side bonding pads 144 to provide electrically conductive paths between the memory die 900 and the logic die 700.

The logic die 700 can include a backside insulating layer 714 located on the backside surface of the logic-die substrate 708. Laterally-insulated through-substrate via structures (711, 712) can be formed through the logic-die substrate 708 to provide electrical contact to various input nodes and output nodes of the first and second periphery circuitries. Each laterally-insulated through-substrate via structure (711, 712) includes a through-substrate conductive via structure 712 and a tubular insulating liner 711 that laterally surrounds the through-substrate conductive via structure 712. Logic-side external bonding pads 716 can be formed on surface portions of the laterally-insulated through-substrate via structures (711, 712).

The memory die 900 and the logic die 700 are positioned such that the logic-side bonding pads 788 of the logic die 700 face memory-side bonding pads 144 of the memory die 900. In one embodiment, the memory die 900 and the logic die 700 can be designed such that the pattern of the logic-side bonding pads 788 of the logic die 700 is the mirror pattern of the pattern of the memory-side bonding pads 144 of the memory die 900. The memory die 900 and the logic die 700 can be bonded to each other by metal-to-metal bonding. For example, metal-to-metal bonding between at least one logic-side bonding pad 788 and the at least one memory-side bonding pad 144 can be induced, for example, by a thermal anneal performed at an elevated temperature.

The peripheral circuit of the logic die 700 includes a power supply circuit (i.e., a source power supply circuit) configured to generate a supply voltage for the source regions 61, and at least one logic-side bonding pad 788 electrically connected to the power supply circuit through a network of logic-side metal interconnect structures 780.

Referring to all drawings and according to various embodiments of the present disclosure, a bonded assembly comprising a memory die 900 and a logic die 700. The memory die 900 comprises: an alternating stack of insulating layers 32 and electrically conductive layers 46 located over a substrate (9, 10); memory stack structures 55 extending through the alternating stack (32, 46), wherein each of the memory stack structures 55 comprises a memory film 50 and a vertical semiconductor channel 60; source regions 61 located on, or in, the substrate (9, 10); source contact structures 76 vertically extending through the alternating stack (32, 46) and contacting the source regions 61; and at least one memory-side bonding pad (such as at least one source-network memory-side bonding pad 144A) electrically connected to the source contact structures 76 through a subset of memory-side metal interconnect structures (which can include source-connection contact via structures 184, first source-connection via structures 114, first source-connection line structures 124, and second source-connection via structures 134). The logic die 700 comprises: a power supply circuit (as embodied as a subset of the semiconductor devices 710 and a subset of the logic-chip metal interconnect structures 780) configured to generate a supply voltage for the source regions 61; and at least one logic-side bonding pad 788 electrically connected to the power supply circuit through a network of logic-side metal interconnect structures 780 and bonded to the at least one memory-side bonding pad (such as at least one source-network memory-side bonding pad 144A).

In one embodiment, the at least one logic-side bonding pad 788 is bonded to the at least one memory-side bonding pad (such as the at least one source-network memory-side bonding pad 144A) through metal-to-metal bonding.

In one embodiment, the at least one memory-side bonding pad 144A comprises a mesh, which may be in the form of a continuous metallic plate including an array of openings therethrough as illustrated in FIG. 14C. In one embodiment, the array of openings in the continuous metallic plate comprises a two-dimensional periodic rectangular array of rectangular openings as illustrated in FIG. 14C. In this embodiment, the at least one logic-side bonding pad 788 comprises a corresponding mesh, which may be in the form of a continuous metallic plate including an array of openings therethrough as illustrated in FIG. 15B. In another embodiment illustrated in FIG. 14D, the array of openings in the continuous metallic plate comprises a two-dimensional non-periodic rectangular array of rectangular openings, which includes smaller openings 145A and larger openings 145B. The larger openings 145B may be used for other connections (e.g., jumpers).

In another embodiment, the at least one memory-side bonding pad 144A comprises an array of memory-side bonding pads, and the at least one logic-side bonding pad 788 comprises an array of logic-side bonding pads as illustrated in FIGS. 14E and 16B. In this embodiment, the array of memory-side bonding pads 144A may be arranged as a two-dimensional periodic array of memory-side bonding pads extending over an area of the memory stack structures 55; and the array of logic-side bonding pads 788 is arranged as a two-dimensional periodic array of logic-side bonding pads having a same two-dimensional periodicity as the two-dimensional periodic array of memory-side bonding pads 144A. In one embodiment, each logic-side bonding pad 788 within the array of logic-side bonding pads is in contact with a set of four memory-side bonding pads 144A among the array of memory-side bonding pads.

In one embodiment, the at least one memory-side bonding pad (such as an array of source-network memory-side bonding pads 144A) is arranged as a two-dimensional periodic array of memory-side bonding pads extending over an area of the memory stack structures 55; and the at least one logic-side bonding pad 788 is arranged as a two-dimensional periodic array of logic-side bonding pads having a same two-dimensional periodicity as the two-dimensional periodic array of memory-side bonding pads (as illustrated in the exemplary layouts of the source-network memory-side bonding pads 144A and the logic-side bonding pads 788 illustrated in FIG. 16B).

In one embodiment, the memory die 900 comprises bit lines 128 located between the memory stack structures 55 and the at least one memory-side bonding pad (such as the at least one source-network memory-side bonding pad 144A), and comprises first additional memory-side bonding pads (such as the bit-line-connection memory-side bonding pads 144C) electrically connected to the bit lines 128 and located in a region (such as the third region 8C in FIG. 14C) laterally offset from the memory stack structures 55; and the logic die 700 comprises first additional logic-side bonding pads 788 bonded to the first additional memory-side bonding pads, and comprises a sense circuit including nodes that are electrically connected to a respective one of the first additional logic-side bonding pads 788.

In one embodiment, the memory die 900 comprises word line contact via structures (embodied as a subset of the layer contact via structures 86) contacting a respective one of the electrically conducive layers 46, and comprises second additional memory-side bonding pads (as embodied as the word-line-connection memory-side bonding pads 144B) electrically connected to a respective one of the word line contact via structures and located in another region (such as a second region RB in FIG. 14C) laterally offset from the memory stack structures 55; and the logic die 700 comprises second additional logic-side bonding pads 788 bonded to the second additional memory-side bonding pads, and comprises a word line driver circuit including nodes that are electrically connected to a respective one of the second additional logic-side bonding pads 788.

In one embodiment, each memory film 50 comprises a layer stack including: a charge storage layer 54 comprising a charge storage material; and a tunneling dielectric 56 contacting the charge storage layer 54 and a respective one of the vertical semiconductor channels 60.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46); the terrace region includes stepped surfaces of the alternating stack (32, 46)

that continuously extend from a bottommost layer within the alternating stack (32, 46) to a topmost layer within the alternating stack (32, 46); and support pillar structures 20 extend through the stepped surfaces and through a retro-stepped dielectric material portion 65 that overlies the stepped surfaces.

In one embodiment, less than 50% of a total area of a contact-side surface of a logic-side bonding pad (which may be any of the logic-side bonding pads 788 that contacts a source-network memory-side bonding pad 144A) among the logic-side bonding pads 788 is in direct contact with contact-side surfaces of the at least one memory-side bonding pad (which may be the contact-side surfaces of the source-network memory-side bonding pads 144A) as illustrated in FIGS. 16A and 16B. As used herein, a contact-side surface of a bonding pad refers to the surface of which at least a portion makes a contact with another bonding structure such as another bonding pad. In one embodiment, the logic-side bonding pad 788 can be in contact with a set of four memory-side bonding pads (such as a set of four source-network memory-side bonding pads 144A) among the at least one memory-side bonding pad 144.

In one embodiment, each of the two-dimensional periodic array of memory-side bonding pads (such as the source-network memory-side bonding pads 144A) and the two-dimensional periodic array of logic-side bonding pads 788 comprises a periodic rectangular array having a first pitch p1 along a first horizontal direction and a second pitch p2 along a second horizontal direction, and the two-dimensional periodic array of memory-side bonding pads is laterally offset from the two-dimensional periodic array of logic-side bonding pads 788 by one half of the first pitch p1 along the first horizontal direction and by one half of the second pitch p2 along the second horizontal direction as illustrated in FIG. 16B.

In one embodiment, each of the memory-side bonding pads (such as the source-network memory-side bonding pads 144A) and the logic-side bonding pads 788 has a respective H-shaped contact-side surface that contains a pair of rail portions extending along a horizontal direction and a connecting portion extending middle sections of the rail portions; and four edge sections of the rail portions of each of the memory-side bonding pads contacts four edge sections of rail portions of four different logic-side bonding pads 788 as illustrated in FIG. 16B.

The combination of the source-network memory-side bonding pads 144A and a subset of the logic-side bonding pads 788 that mate with the source-network memory-side bonding pads 144A provides a power distribution network for distributing source power supply voltage to the source regions 61 over the entire area of the memory array region 100. By forming power distribution networks within the logic die 700, the level of wiring in the memory die 900 can be reduced. The mating pairs of the source-network memory-side bonding pads 144A and a subset of the logic-side bonding pads 788 illustrated in FIGS. 15A and 15B or the interlocking set of source-network memory-side bonding pads 144A and logic-side bonding pads 788 illustrated in FIGS. 16A and 16B can provide power distribution network for providing the source supply voltage uniformly across the memory array region.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded assembly comprising a memory die bonded to a logic die, wherein:
the memory die comprises:
an alternating stack of insulating layers and electrically conductive layers located over a substrate;
memory stack structures extending through the alternating stack, wherein each of the memory stack structures comprises a memory film and a vertical semiconductor channel;
source regions located on or in the substrate;
source contact structures vertically extending through the alternating stack and contacting the source regions; and
at least one memory-side bonding pad electrically connected to the source contact structures through a subset of memory-side metal interconnect structures; and
the logic die comprises:
a power supply circuit configured to generate a supply voltage for the source regions; and
at least one logic-side bonding pad electrically connected to the power supply circuit through a network of logic-side metal interconnect structures and bonded to the at least one memory-side bonding pad.

2. The bonded assembly of claim 1, wherein the at least one logic-side bonding pad is bonded to the at least one memory-side bonding pad through metal-to-metal bonding.

3. The bonded assembly of claim 1, wherein the at least one memory-side bonding pad comprises a mesh.

4. The bonded assembly of claim 3, wherein the mesh comprises a continuous metallic plate having an array of openings therethrough.

5. The bonded assembly of claim 1, wherein:
the at least one memory-side bonding pad comprises an array of memory-side bonding pads; and
the at least one logic-side bonding pad comprises an array of logic-side bonding pads.

6. The bonded assembly of claim 5, wherein:
the array of memory-side bonding pads is arranged as a two-dimensional periodic array of memory-side bonding pads extending over an area of the memory stack structures; and
the array of logic-side bonding pads is arranged as a two-dimensional periodic array of logic-side bonding pads having a same two-dimensional periodicity as the two-dimensional periodic array of memory-side bonding pads.

7. The bonded assembly of claim 6, wherein each logic-side bonding pad within the array of logic-side bonding pads is in contact with a set of four memory-side bonding pads among the array of memory-side bonding pads.

8. The bonded assembly of claim 6, wherein:
- each of the two-dimensional periodic array of memory-side bonding pads and the two-dimensional periodic array of logic-side bonding pads comprises a periodic rectangular array having a first pitch along a first horizontal direction and a second pitch along a second horizontal direction; and
- the two-dimensional periodic array of memory-side bonding pads is laterally offset from the two-dimensional periodic array of logic-side bonding pads by one half of the first pitch along the first horizontal direction and by one half of the second pitch along the second horizontal direction.

9. The bonded assembly of claim 8, wherein:
- each of the memory-side bonding pads and the logic-side bonding pads has a respective H-shaped contact-side surface that contains a pair of rail portions extending along a horizontal direction and a connecting portion extending middle sections of the rail portions; and
- four edge sections of the rail portions of each of the memory-side bonding pads contacts four edge sections of rail portions of four different logic-side bonding pads.

10. The bonded assembly of claim 1, wherein:
- the memory die comprises bit lines located between the memory stack structures and the at least one memory-side bonding pad, and comprises first additional memory-side bonding pads electrically connected to the bit lines and located in a region laterally offset from the memory stack structures; and
- the logic die comprises first additional logic-side bonding pads bonded to the first additional memory-side bonding pads, and comprises a sense circuit including nodes that are electrically connected to a respective one of the first additional logic-side bonding pads.

11. The bonded assembly of claim 10, wherein:
- the memory die comprises word line contact via structures contacting a respective one of the electrically conductive layers, and comprises second additional memory-side bonding pads electrically connected to a respective one of the word line contact via structures and located in another region laterally offset from the memory stack structures; and
- the logic die comprises second additional logic-side bonding pads bonded to the second additional memory-side bonding pads, and comprises a word line driver circuit including nodes that are electrically connected to a respective one of the second additional logic-side bonding pads.

12. The bonded assembly of claim 1, wherein each memory film comprises a layer stack including:
- a charge storage layer comprising a charge storage material; and
- a tunneling dielectric contacting the charge storage layer and a respective one of the vertical semiconductor channels.

13. The bonded assembly of claim 1, wherein:
- the alternating stack comprises a terrace region in which each electrically conductive layer other than a topmost electrically conductive layer within the alternating stack laterally extends farther than any overlying electrically conductive layer within the alternating stack;
- the terrace region includes stepped surfaces of the alternating stack that continuously extend from a bottommost layer within the alternating stack to a topmost layer within the alternating stack; and
- support pillar structures extend through the stepped surfaces and through a retro-stepped dielectric material portion that overlies the stepped surfaces.

14. A method of forming a bonded assembly, comprising:
- providing a memory die that comprises:
  - an alternating stack of insulating layers and electrically conductive layers located over a substrate,
  - memory stack structures extending through the alternating stack, wherein each of the memory stack structures comprises a memory film and a vertical semiconductor channel,
  - source regions located on, or in, the substrate,
  - source contact structures vertically extending through the alternating stack and contacting the source regions, and
  - at least one memory-side bonding pad electrically connected to the source contact structures through a subset of memory-side metal interconnect structures;
- a power supply circuit configured to generate a supply voltage for the source regions, and
  - at least one logic-side bonding pad electrically connected to the power supply circuit through a network of logic-side metal interconnect structures; and
- bonding the at least one logic-side bonding pad to the at least one memory-side bonding pad.

15. The method of claim 14, wherein bonding of the at least one logic-side bonding pad to the at least one memory-side bonding pad is performed by inducing metal-to-metal bonding between the at least one logic-side bonding pad and the at least one memory-side bonding pad.

16. The method of claim 14, wherein the at least one memory-side bonding pad comprises a mesh.

17. The method of claim 16, wherein:
- the mesh comprises a continuous metallic plate having an array of openings therethrough; and
- the array of openings in the continuous metallic plate comprises a two-dimensional periodic rectangular array of rectangular openings.

18. The method of claim 14, wherein:
- the at least one memory-side bonding pad comprises an array of memory-side bonding pads; and
- the at least one logic-side bonding pad comprises an array of logic-side bonding pads.

19. The method of claim 18, wherein:
- the array of memory-side bonding pads is arranged as a two-dimensional periodic array of memory-side bonding pads extending over an area of the memory stack structures; and
- the array of logic-side bonding pads is arranged as a two-dimensional periodic array of logic-side bonding pads having a same two-dimensional periodicity as the two-dimensional periodic array of memory-side bonding pads.

20. The method of claim 19, wherein each of the logic-side bonding pads is in contact with a respective set of four memory-side bonding pads among the array of memory-side bonding pads upon bonding the array of logic-side bonding pads to the array of memory-side bonding pads.

* * * * *